(12) United States Patent
Hayashi et al.

(10) Patent No.: US 7,495,387 B2
(45) Date of Patent: Feb. 24, 2009

(54) ORGANIC ELECTROLUMINESCENT ELEMENT AND ORGANIC ELECTROLUMINESCENT DEVICE INCLUDING THE SAME

(75) Inventors: Kazuhiko Hayashi, Tokyo (JP); Takashi Funuchi, Tokyo (JP); Shinzo Tsuboi, Tokyo (JP); Ichiro Fujieda, Tokyo (JP)

(73) Assignee: Samsung SDI Co., Ltd., Suwon (KR)

( * ) Notice: Subject to any disclaimer, the term of this patent is extended or adjusted under 35 U.S.C. 154(b) by 47 days.

(21) Appl. No.: 10/467,081

(22) PCT Filed: Feb. 4, 2002

(86) PCT No.: PCT/JP02/00882

§ 371 (c)(1),
(2), (4) Date: May 28, 2004

(87) PCT Pub. No.: WO02/063928

PCT Pub. Date: Aug. 15, 2002

(65) Prior Publication Data

US 2004/0245937 A1   Dec. 9, 2004

(30) Foreign Application Priority Data

Feb. 5, 2001   (JP) .............................. 2001-028721

(51) Int. Cl.
*H01J 1/62* (2006.01)
(52) U.S. Cl. ...................... 313/505; 313/506
(58) Field of Classification Search ............... 313/500, 313/504–506
See application file for complete search history.

(56) References Cited

U.S. PATENT DOCUMENTS

| | | | | | |
|---|---|---|---|---|---|
| 5,053,675 | A | * | 10/1991 | Thioulouse | 313/505 |
| 5,589,733 | A | * | 12/1996 | Noda et al. | 313/509 |
| 5,652,067 | A | * | 7/1997 | Ito et al. | 313/505 |
| 5,837,391 | A | * | 11/1998 | Utsugi | 313/505 |
| 5,922,481 | A | * | 7/1999 | Etzbach et al. | 428/690 |

(Continued)

FOREIGN PATENT DOCUMENTS

JP   01-124284   5/1989

(Continued)

OTHER PUBLICATIONS

D. R. Baigent, et al., "Conjugated Polymer Light-Emitting Diodes on Silicon Substrates", Appl. Phys. Lett., vol. 65 (21), Nov. 21, 1994, pp. 2636-2638.

(Continued)

*Primary Examiner*—Peter Macchiarolo
(74) *Attorney, Agent, or Firm*—H.C. Park & Associates, PLC

(57) ABSTRACT

An emitting device in an organic electroluminescent device is disclosed, in which a lower electrode pattern is formed on a substrate, an emitting layer pattern is formed on the lower electrode pattern, and a transparent electrode is formed on the emitting layer pattern and an emitting body having a structure in which an organic thin film emits light when an application current is applied to it. The pattern of the transparent electrode completely covers and is larger than that of the lower electrode. The pattern of the transparent electrode is formed over the entire area of the pattern of the lower electrode.

20 Claims, 24 Drawing Sheets

U.S. PATENT DOCUMENTS

| | | | | |
|---|---|---|---|---|
| 6,057,048 | A | * | 5/2000 | Hu et al. .................. 313/505 |
| 6,303,963 | B1 | * | 10/2001 | Ohtani et al. .............. 257/350 |
| 6,429,599 | B1 | * | 8/2002 | Yokoyama ................ 313/504 |
| 6,433,487 | B1 | * | 8/2002 | Yamazaki ................ 315/169.3 |
| 6,657,378 | B2 | * | 12/2003 | Forrest et al. .............. 313/503 |
| 6,833,668 | B1 | * | 12/2004 | Yamada et al. ............. 313/505 |
| 2005/0023972 | A1 | * | 2/2005 | Lewandowski et al. ..... 313/509 |

FOREIGN PATENT DOCUMENTS

| | | |
|---|---|---|
| JP | 08-64931 | 3/1996 |
| JP | 8-124677 | 5/1996 |
| JP | 09-34130 | 2/1997 |
| JP | 10-161564 | 6/1998 |
| JP | 10-219400 | 8/1998 |
| JP | 11-176720 | 7/1999 |
| JP | 2000-156557 | 6/2000 |
| JP | 2000-173766 | 6/2000 |
| JP | 2001-5426 | 1/2001 |
| JP | 2001-195008 | 7/2001 |
| WO | WO 97/48139 | 12/1997 |
| WO | WO 99/05788 | 2/1999 |

OTHER PUBLICATIONS

C. W. Tang, et al., "Organic Electroluminescent Diodes", Appl. Phys. Lett., vol. 51 (12), Sep. 21, 1987, pp. 913-915.

* cited by examiner

| 4a | 4a | 16 | 16 |
|---|---|---|---|
|  | 15 | 4a | 4a |
| 9 | 9 | 9 | 15 |
| 2a | 2a | 2a | 9 |
|  |  |  | 2a |

FIG. 10A  FIG. 10B  FIG. 10C  FIG. 10D

| 4a | 4a | 16 | 16 |
|---|---|---|---|
| 8 | 15 | 4a | 4a |
| 10 | 8 | 8 | 15 |
| 2a | 10 | 10 | 8 |
|  | 2a | 2a | 10 |
|  |  |  | 2a |

| 4a |
|---|
| 11 |
| 6 |
| 2a |

FIG. 12B

| 4a |
|---|
| 15 |
| 11 |
| 6 |
| 2a |

FIG. 12C

| 16 |
|---|
| 4a |
| 11 |
| 6 |
| 2a |

FIG. 12D

| 16 |
|---|
| 4a |
| 15 |
| 11 |
| 6 |
| 2a |

FIG. 13A

| 4a |
|---|
| 8 |
| 7 |
| 6 |
| 2a |

FIG. 13B

| 4a |
|---|
| 15 |
| 8 |
| 7 |
| 6 |
| 2a |

FIG. 13C

| 16 |
|---|
| 4a |
| 8 |
| 7 |
| 6 |
| 2a |

FIG. 13D

| 16 |
|---|
| 4a |
| 15 |
| 8 |
| 7 |
| 6 |
| 2a |

FIG. 33
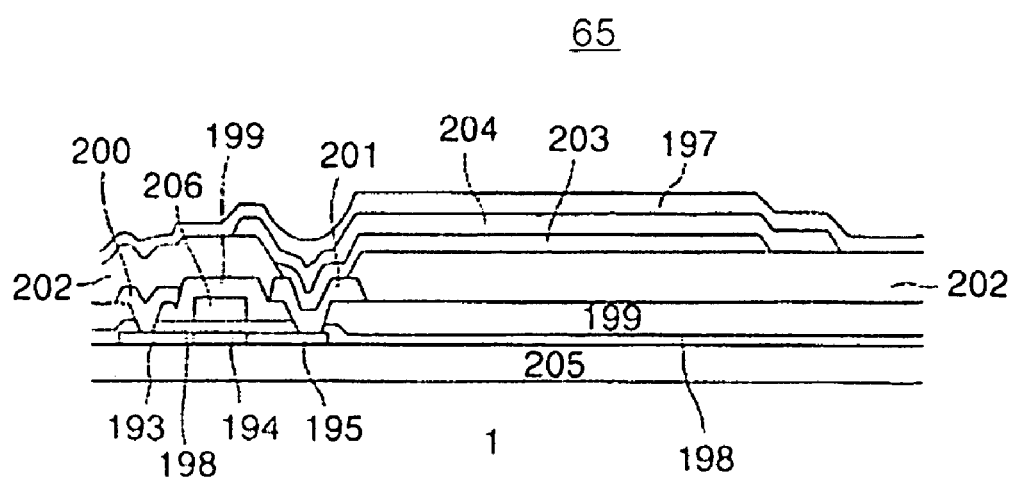
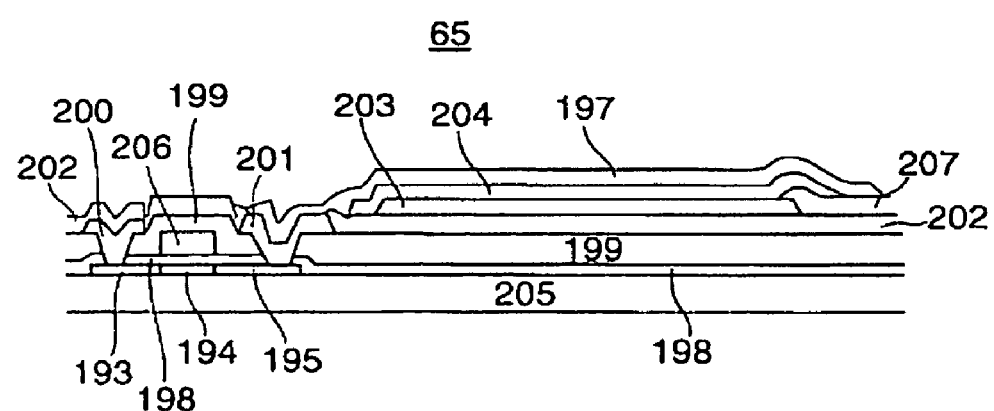
FIG. 34

1

205
1

180

ORGANIC ELECTROLUMINESCENT ELEMENT AND ORGANIC ELECTROLUMINESCENT DEVICE INCLUDING THE SAME

TECHNICAL FIELD

The present invention relates to a light emitting device technology and, in particular, relates to a light emitter, a light emitting element, and a light emitting display device, which can provide a light emitting element structure than can ensure a long-term element light-emitting life duration with respect to a light emitting element of a film surface light-emitting type that can obtain a large aperture ratio, that can omit sealing of the light emitting element, and that can form a protective layer after transferring it to another film forming apparatus by breaking vacuum after formation of a transparent electrode.

BACKGROUND ART

In general, as self-emitters of light for use in display devices, there are field emission elements and electroluminescence (EL) elements. Among them, the EL elements are divided into an organic EL element using an organic material as a light emitting layer, and an inorganic EL element using an inorganic material as a light emitting layer.

The organic EL element comprises an anode, a cathode, and an organic EL layer of a very thin film that is sandwiched between the electrodes of two kinds, i.e. the anode and the cathode, and made of an organic light-emitting compound. When a voltage is applied between the anode and the cathode, holes from the anode and electrons from the cathode are respectively injected into the organic EL layer and recombined, and molecules of the organic light-emitting compound forming the organic EL layer are excited due to energy produced thereupon. In the course of deactivation of the molecules thus excited toward the ground state, a luminous phenomenon is generated. The organic EL element is a light emitter utilizing this luminous phenomenon.

The organic EL layer has a single-layer structure or a multilayer stacked structure including at least one of an organic layer called a light emitting layer that emits light by recombination of holes and electrons, an organic layer called a hole transport layer that is liable to be injected with holes and reluctant to move electrons, and an organic layer called an electron transport layer that is liable to be injected with electrons and reluctant to move holes.

In recent years, the organic EL elements have been actively studied and being put to practical use. The organic EL element is an element having a basic structure wherein a thin film of a hole injection material such as triphenyidiamine (TPD) is formed by vapor deposition on a transparent electrode (hole injection electrode, i.e. anode) such as tin-doped indium oxide (ITO), and further, a fluorescent substance such as aluminum-quinolinol complex (Alq3) is stacked as a light emitting layer, and further, a metal electrode (electron injection electrode, i.e. cathode) such as AgMg having a small work function is formed. Inasmuch as a very high luminance, i.e. several 100 to several 10000 cd/m$^2$, can be obtained at an applied voltage of about 10V, attention has been paid thereto for household electrical appliances, electrical equipment of automobiles, bicycles, airplanes, etc., displays, and so on.

Such an organic EL element has a structure wherein, for example, an organic layer such as a light emitting layer is sandwiched between a scan (common line) electrode serving as an electron injection electrode, and a data (segment line) electrode serving as a hole injection electrode (transparent electrode), and formed on a transparent (glass) substrate. Those that are formed as displays are roughly divided into a matrix display that carries out dot display using scan electrodes and data electrodes arranged in a matrix, thereby to display information of an image, a character, or the like as an aggregate of those dots (pixels), and a segment display that displays those that independently exist as indicators having predetermined shapes and sizes.

In case of the segment display, it is also possible to adopt a static driving system that displays the respective indicators separately and independently. On the other hand, in case of the matrix display, a dynamic driving system is normally adopted wherein respective scan lines and data lines are driven in a time sharing manner.

Light emitters each forming a light emitting portion of an organic EL element are divided into a substrate surface light emitting type that uses a structure of a transparent substrate/a transparent electrode/a light emitting layer/a metal electrode wherein light generated in the light emitting layer is transmitted through the transparent electrode and the transparent substrate so as to be emitted, and a film surface light emitting type that uses a structure of a substrate/a metal electrode/a light emitting layer/a transparent electrode wherein light generated in the light emitting layer is transmitted through the transparent electrode so as to be emitted from the side of the film surface opposite to the side of the substrate surface.

The element of the substrate surface light emitting type is described in, for example, Applied Physical Letter, vol. 51, pp. 913-915 (1987) (Appl. Phys. Lett., 51, 913-915 (1987)).

The element of the film surface light emitting type is described in, for example, Applied Physical Letter, vol. 65, pp. 2636-2638 (1994) (Appl. Phys. Lett., 65, 2636-2638 (1994)).

However, in case of the foregoing substrate surface light emitting type, there has been raised a problem that since light is emitted from the side of the substrate surface, if an opaque substance such as a driving circuit or wiring is inserted between the substrate surface and the light emitting surface, light is blocked so that the aperture ratio and the luminance are lowered. Further, there has been a problem that since the metal electrode and the light emitting layer that are liable to be corroded are provided on the transparent electrode, unless sealing of the element is carried out without breaking vacuum after formation of the metal electrode, the light emitting property is degraded. The sealing technique for the light emitter is described in, for example, Laid-open Unexamined Patent Publication No. H8-124677.

On the other hand, in case of the foregoing film surface light emitting type, even if a driving circuit, wiring or the like is inserted between the substrate surface and the light emitting surface, the aperture ratio is not lowered. Further, the metal electrode and the light emitting layer that are liable to be corroded are located between the transparent electrode and the substrate. Therefore, by selecting sizes and a positional relationship of patterns of the metal electrode, the light emitting layer and the transparent electrode, the light emitting property is not immediately degraded even if vacuum is broken after film formation of the transparent electrode, so that it becomes possible to omit sealing of the light emitting element, and to form a protective layer after transfer into another film forming apparatus by once breaking vacuum after the formation of the transparent electrode.

The present invention has been made in view of the foregoing problems and has an object to provide a light emitter, a light emitting element, and a light emitting display device, which can provide a light emitting element structure than can ensure a long-term element light-emitting life duration with respect to a light emitting element of a film surface light-emitting type that can obtain a large aperture ratio, that can omit sealing of the light emitting element, and that can form a protective layer after transferring it to another film forming apparatus by breaking vacuum after formation of a transparent electrode.

DISCLOSURE OF THE INVENTION

For example, the gist of a first invention of the present invention resides in a light emitter in which a pattern of a lower electrode is formed on a base, a pattern of a light emitting layer is formed on the pattern of said lower electrode, and a transparent electrode is formed on the pattern of said light emitting layer, said light emitter characterized in that a pattern of said transparent electrode is larger than the pattern of said lower electrode.

Further, the gist of a second invention of the present invention resides in a light emitter in which a pattern of a lower electrode is formed on a base, a pattern of a light emitting layer is formed on the pattern of said lower electrode, and a transparent electrode is formed on the pattern of said light emitting layer, said light emitter characterized in that a pattern of said transparent electrode is formed over all the area of the pattern of said lower electrode.

Further, the gist of a third invention of the present invention resides in a light emitter in which a pattern of a lower electrode is formed on a base, a pattern of a light emitting layer is formed on the pattern of said lower electrode, and a transparent electrode is formed on the pattern of said light emitting layer, said light emitter characterized in that a pattern of said transparent electrode is larger than the pattern of said light emitting layer.

Further, the gist of a fourth invention of the present invention resides in a light emitter in which a pattern of a lower electrode is formed on a base, a pattern of a light emitting layer is formed on the pattern of said lower electrode, and a transparent electrode is formed on the pattern of said light emitting layer, said light emitter characterized in that a pattern of said transparent electrode is formed over all the area of the pattern of said light emitting layer.

Further, the gist of a fifth invention of the present invention resides in a light emitter according to any of the first to fourth inventions, characterized in that an element portion comprising said transparent electrode, said light emitting layer, and said lower electrode is an electroluminescence element.

Further, the gist of a sixth invention of the present invention resides in a light emitter according to the fifth invention, characterized in that said electroluminescence element has a structure in which an organic thin film emits light due to applied current.

Further, the gist of a seventh invention of the present invention resides in a light emitter according to the fifth or sixth invention, characterized in that a hole injection layer is formed between said transparent electrode and said light emitting layer.

Further, the gist of an eighth invention of the present invention resides in a light emitter according to any of the fifth to seventh inventions, characterized in that an electron transport layer is formed between said transparent electrode and said light emitting layer.

Further, the gist of a ninth invention of the present invention resides in a light emitter according to the eighth invention, characterized in that a plurality of light emitters are independently formed in the state commonly using said electron transport layer.

Further, the gist of a tenth invention of the present invention resides in a light emitter according to the fifth or sixth invention, characterized by comprising a lower electrode layer formed on said base, an electron transport layer formed on said lower electrode layer, a light emitting layer formed on said electron transport layer and serving as a hole injection layer, and a metal electrode layer formed on said light emitting layer.

Further, the gist of an eleventh invention of the present invention resides in a light emitter according to the seventh or tenth invention, characterized in that a plurality of light emitters are independently formed in the state commonly using the hole injection layer.

Further, the gist of a twelfth invention of the present invention resides in a light emitter according to the fifth or sixth invention, characterized by comprising a transparent electrode layer formed on an end surface of a light guide member, a light emitting layer formed on said transparent electrode layer and serving also as a hole injection layer and an electron transport layer, and a metal electrode layer formed on said light emitting layer.

Further, the gist of a thirteenth invention of the present invention resides in a light emitter according to any of the first to twelfth inventions, characterized in that a plurality of light emitters are independently formed in the state commonly using said transparent electrode layer.

Further, the gist of a fourteenth invention of the present invention resides in a light emitter according to any of the first to thirteenth inventions, characterized by comprising at least three independent light emitters arrayed two-dimensionally, wherein a first light emitter or light emitter group emits light at wavelengths in a red region, a second light emitter or light emitter group emits light at wavelengths in a green region, and a third light emitter or light emitter group emits light at wavelengths in a blue region.

Further, the gist of a fifteenth invention of the present invention resides in a light emitter according to the fourteenth invention, characterized by having a structure that can simultaneously emit light at wavelengths in the red region, the green region and the blue region.

Further, the gist of a sixteenth invention of the present invention resides in a light emitter according to any of the first to thirteenth inventions, characterized in that a plurality of light emitters are arrayed independently and two-dimensionally, wherein each of them emits light in a mixed color of light in a blue region, light in a red region, and light in a green region.

Further, the gist of a seventeenth invention of the present invention resides in a light emitting element characterized by being constituted of an element portion having the light emitter according to any of the sixth to sixteenth inventions, and a current applying element electrically connected to said element portion for applying current to said element portion.

Further, the gist of an eighteenth invention of the present invention resides in a light emitting element according to the seventeenth invention, characterized in that said current applying element comprises a thin film transistor having a gate, a drain and a source, and one of said transparent electrode and said lower electrode is connected to one of said drain and said source.

Further, the gist of a nineteenth invention of the present invention resides in a light emitting element according to the seventeenth or eighteenth invention, characterized by including a switching element connected to said current applying element for selecting whether said current applying element flows current to said element portion comprising said transparent electrode, said light emitting layer and said lower electrode.

Further, the gist of a twentieth invention of the present invention resides in a light emitting element according to the nineteenth invention, characterized in that said switching element is configured to include at least one transistor, and a drain of the transistor included in said switching element is connected to a gate of a transistor included in said current applying element.

Further, the gist of a twenty-first invention of the present invention resides in a light emitting element according to the nineteenth or twentieth invention, characterized by including a switching element connected to said current applying element for selecting whether said current applying element flows current to said element portion comprising said transparent electrode, said light emitting layer and said lower electrode, and by including wiring for feeding current to said current applying element, and wiring for applying ON/OFF voltage information to said switching element.

Further, the gist of a twenty-second invention of the present invention resides in a light emitting display device characterized by including a plurality of light emitting elements each according to the twenty-first invention, wherein wiring for feeding current to said current applying element, and wiring for applying ON/OFF voltage information to said switching element and wiring for feeding current to said current applying element are arranged in a matrix.

Further, the gist of a twenty-third invention of the present invention resides in a light emitting display device according to the twenty-second invention, characterized in that an angle between wiring arranged in one direction and wiring arranged in another direction relative thereto is approximately perpendicular.

BRIEF DESCRIPTION OF THE DRAWINGS

FIGS. 10A to 10D are diagrams showing one embodiment of stacked structures of light emitters that are applicable to the present invention;

FIGS. 11A to 11D are diagrams showing one embodiment of stacked structures of light emitters that are applicable to the present invention;

FIGS. 12A to 12D are diagrams showing one embodiment of stacked structures of light emitters that are applicable to the present invention;

FIGS. 13A to 13D are diagrams showing one embodiment of stacked structures of light emitters that are applicable to the present invention;

FIG. 33 is a sectional schematic view showing a structure of a light emitting element according to one embodiment of the present invention;

FIG. 34 is a sectional schematic view showing a structure of a light emitting element according to one embodiment of the present invention;

BEST MODE FOR CARRYING OUT THE INVENTION

Embodiment 1

Figure 1A:
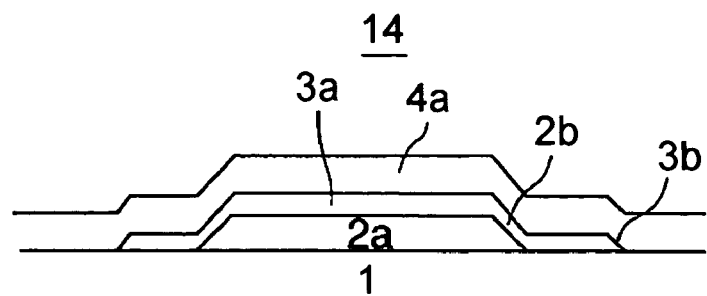
FIG. 1A is a sectional structure schematic view showing a light emitter according to one embodiment of the present invention.
Figure 1B:
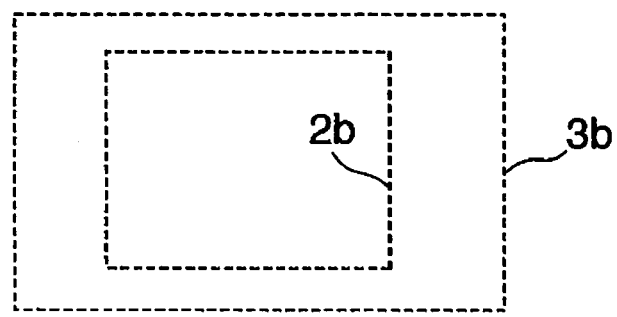
FIG. 1B is a top perspective view thereof.

Hereinbelow, an embodiment 1 of the present invention will be described in detail based on the drawings. FIG. 1A is a sectional schematic view showing a light emitter 14 of the present invention, and FIG. 1B is a top schematic view thereof. A base 1 is an object forming the light emitter 14, and includes a substrate or one comprising a substrate and a film or element formed thereon (hereinafter also applied). A pattern of a lower electrode 2a is formed on the base 1. On the lower electrode 2a is formed a pattern of a light emitting material layer 3a. The light emitting material layer 3a is a portion including at least a light emitting layer (e.g. later-described light emitting layer 7), which may also include an electron transport layer (later-described electron transport layer 6) or a hole injection layer (later-described hole injection layer 8) other than the light emitting layer (hereinafter also applied).

The pattern of the light emitting material layer 3a is larger than the pattern of the lower electrode 2a, and covers all the area of the pattern of the lower electrode 2a. That is, a pattern end portion 3b of the light emitting material layer 3a is located outside a pattern end portion 2b of the lower electrode 2a in all the area. A transparent electrode 4a is formed over the pattern of the light emitting material layer 3a. In FIG. 1A, the transparent electrode 4a is shown like it is not patterned. However, this means that a pattern thereof is so large that it can not be patterned in the range shown in the figure.

In the element structure of this embodiment, the transparent electrode 4a that is reluctant to corrode and is small in moisture permeability is formed over all the area of the lower electrode 2a and the light emitting material layer 3a. Therefore, even if the light emitter 14 having the element structure of this embodiment is exposed to the atmosphere by breaking vacuum, the lower electrode 2a and the light emitting material layer 3a can be shielded from moisture and oxygen contained in the atmosphere, so that the lower electrode 2a and the light emitting material layer 3a can be prevented from corrosion.

Further, in this embodiment, a protective layer (later-described protective layer 16 shown in FIGS. 10 to 13) for strongly shielding the lower electrode 2a and the light emitting material layer 3a from water and oxygen in the atmosphere may also be formed on the transparent electrode 4a.

Embodiment 2

Figure 2A:
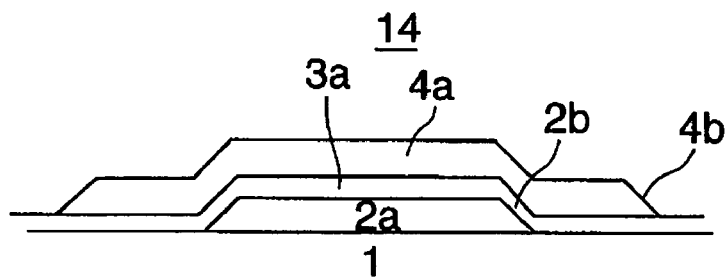
FIG. 2A is a sectional structure schematic view showing a light emitter according to one embodiment of the present invention.
Figure 2B:
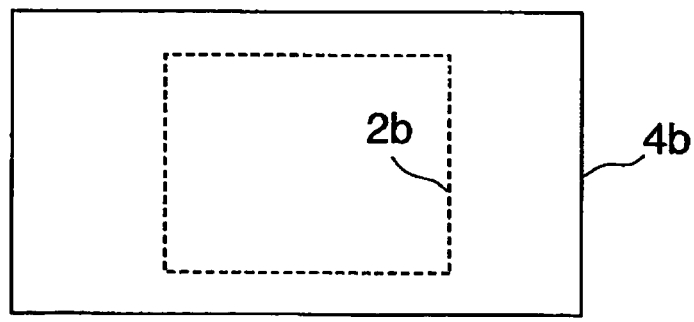
FIG. 2B is a top perspective view thereof.

Hereinbelow, an embodiment 2 of the present invention will be described in detail based on the drawings. The same symbols are assigned to those portions that are the same as those already described in the foregoing embodiment, thereby to omit overlapping description. FIG. 2A is a sectional schematic view showing a light emitter 14 of the present invention, and FIG. 2B is a top schematic view thereof. A pattern of a lower electrode 2a is formed on a base 1. On the lower electrode 2a is formed a pattern of a light emitting material layer 3a. The pattern of the light emitting material layer 3a is larger than the pattern of the lower electrode 2a, and covers all the area of the pattern of the lower electrode 2a. In FIG. 2A, the light emitting material layer 3a is shown like it is not patterned. However, this means that a pattern thereof is so large that it can not be patterned in the range shown in the figure. A pattern of a transparent electrode 4a is formed on the light emitting material layer 3a. The pattern of the transparent electrode 4a is small than the pattern of the light emitting material layer 3a, but larger than the pattern of the lower electrode 2a. Further, all the area of the pattern of the lower electrode 2a is covered with the pattern of the transparent electrode 4a. That is, a pattern end portion 2b of the lower electrode 2a is located inside a pattern end portion 4b of the transparent electrode 4a in all the area.

In the element structure of this embodiment, the transparent electrode 4a that is reluctant to corrode and is small in moisture permeability is formed over all the area of the pattern of the lower electrode 2a and the light emitting material layer 3a. Here, the light emitting material layer 3a represents a portion of the light emitting material layer 3a, which is sandwiched between the pattern of the lower electrode 2a and the transparent electrode 4a and emits light by applying a voltage across the lower electrode 2a and the transparent electrode 4a. In this case, it approximately coincides with such a portion of the light emitting material layer 3a that is in contact with the lower electrode 2a. Even if the light emitter 14 having the element structure of this embodiment is exposed to the atmosphere by breaking vacuum, the lower electrode 2a can be shielded from moisture and oxygen contained in the atmosphere, so that the lower electrode 2a can be prevented from corrosion.

Further, in the element structure of this embodiment, it is not necessary that the light emitting material layer 3a is precisely patterned to cover all the pattern of the lower electrode 2a and to be covered with the pattern of the transparent electrode 4a. Therefore, as compared with the structure shown in FIGS. 1A and 1B, fabrication is easy and reduction in fabrication cost can be achieved. However, of the light emitting material layer 3a, a portion not covered with the pattern of the transparent electrode 4a can not be shielded from oxygen and water. This area is away from the light emitting material layer 3a and has no direct relation to light emission. However, it is possible that corrosion of this area triggers exfoliation or the like of the light emitting material layer 3a to give influence on a light emission property. For using the element structure of this embodiment, it is desirable that a material reluctant to be corroded by water or oxygen is used for the light emitting layer.

In this embodiment, the case is shown wherein the pattern of the transparent electrode 4a is all formed on the pattern of the light emitting material layer 3a. However, such a case is also included wherein part of it is formed outside the pattern of the light emitting material layer 3a.

Further, in the element structure of this embodiment, a protective layer (later-described protective layer 16 shown in FIGS. 10 to 13) for strongly shielding the lower electrode 2a and the light emitting material layer 3a from water and oxygen in the atmosphere may also be formed on the transparent electrode 4a.

Embodiment 3

Figure 3A:
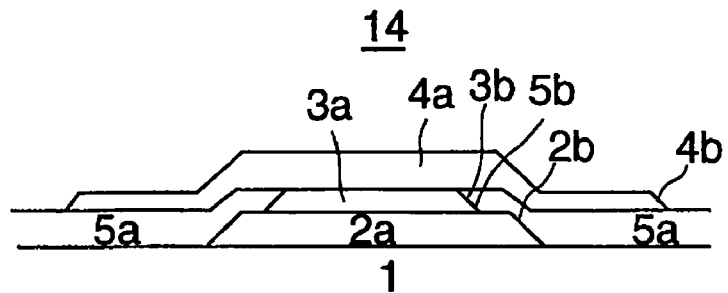
FIG. 3A is a sectional structure schematic view showing a light emitter according to one embodiment of the present invention.
Figure 3B:
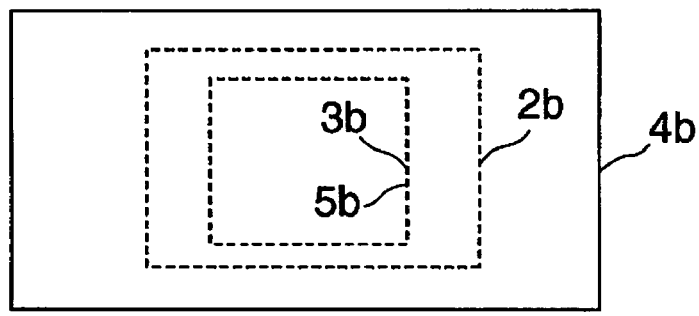
FIG. 3B is a top perspective view thereof.

Hereinbelow, an embodiment 3 of the present invention will be described in detail based on the drawings. The same symbols are assigned to those portions that are the same as those already described in the foregoing embodiments, thereby to omit overlapping description. FIG. 3A is a sectional schematic view showing a light emitter 14 of the present invention, and FIG. 3B is a top schematic view thereof. A pattern of a lower electrode 2a is formed on a base 1. On the lower electrode 2a is formed a pattern of a light emitting material layer 3a. Here, a case is shown wherein the pattern of the light emitting material layer 3a is all formed on the pattern of the lower electrode 2a. An insulating layer 5a is formed such that a pattern end portion 5b of the insulating layer 5a contacts with an end portion 3b of the light emitting material layer 3a. A pattern of a transparent electrode 4a is formed on the pattern of the light emitting material layer 3a so as to cover all of it.

In the element structure of this embodiment, the transparent electrode 4a or the insulating layer 5a is formed over all the area of the pattern of the lower electrode 2a. Further, the transparent electrode 4a is formed over all the area of the light emitting material layer 3a. Therefore, even if the light emitter 14 having the element structure of this embodiment is exposed to the atmosphere, the lower electrode 2a and the light emitting material layer 3a can be shielded from moisture and oxygen contained in the atmosphere by means of the transparent electrode 4a and the insulating layer 5a, so that the lower electrode 2a and the light emitting material layer 3a can be prevented from corrosion.

Further, the element structure of this embodiment is a structure wherein the patterns of the lower electrode 2a and the light emitting material layer 3a are buried using the insulating layer 5a, so that an upper surface of the element can be made relatively flat. Further, the pattern of the light emitting material layer 3a and the pattern of the lower electrode 2a can be firmly covered with the transparent electrode 4a and the insulating layer 5a, so that it is excellent in anticorrosion against oxygen and water. However, inasmuch as it is necessary to use the insulating layer 5a, one process is additionally required to increase the fabrication cost correspondingly.

Further, in the element structure of this embodiment, a protective layer (later-described protective layer 16 shown in FIGS. 10 to 13) for strongly shielding the lower electrode 2a and the light emitting material layer 3a from water and oxygen in the atmosphere may also be formed on the transparent electrode 4a.

Embodiment 4

Figure 4A:
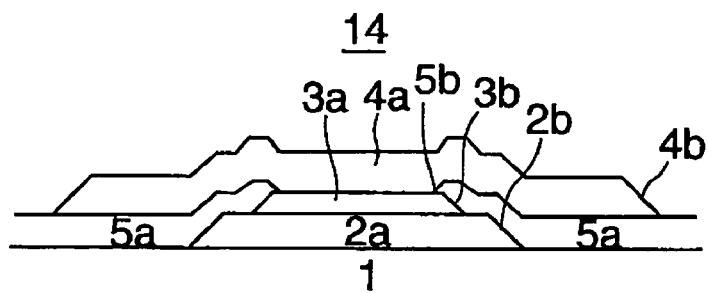
FIG. 4A is a sectional structure schematic view showing a light emitter according to one embodiment of the present invention.
Figure 4B:
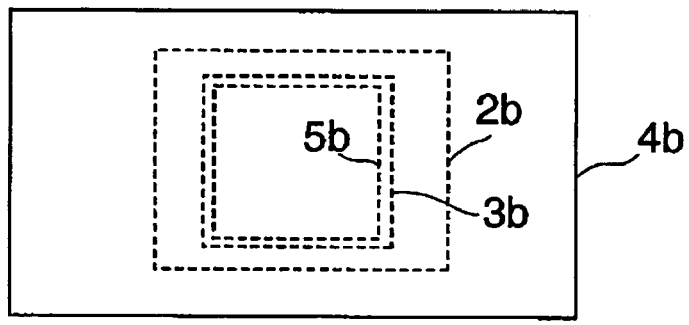
FIG. 4B is a top perspective view thereof.

Hereinbelow, an embodiment 4 of the present invention will be described in detail based on the drawings. The same symbols are assigned to those portions that are the same as those already described in the foregoing embodiments, thereby to omit overlapping description. An element structure shown in FIGS. 4A and 4B is a modification of the element structure shown in FIGS. 3A and 3B, wherein a pattern end portion 5b of an insulating layer 5a rides on a pattern of a light emitting material layer 3a. By providing an overlapping portion of the insulating layer 5a and the light emitting material layer 3a, it is possible to reduce occurrence of leakage current between a pattern of a lower electrode 2a and a pattern of a transparent electrode 4a, which is caused by a fabrication error. On the other hand, because of the existence of the overlapping portion of the insulating layer 5a and the light emitting material layer 3a, flatness of an upper surface of the element is degraded as compared with the case of the foregoing embodiment 3 (FIG. 3).

Further, in the element structure of this embodiment, a protective layer (later-described protective layer 16 shown in FIGS. 10 to 13) for strongly shielding the lower electrode 2a and the light emitting material layer 3a from water and oxygen in the atmosphere may also be formed on the transparent electrode 4a.

Embodiment 5

Figure 5A:
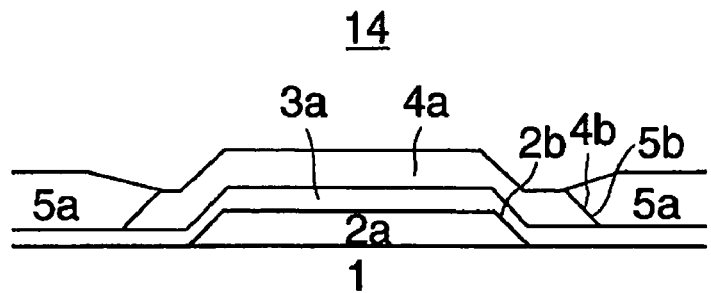
FIG. 5A is a sectional structure schematic view showing a light emitter according to one embodiment of the present invention.
Figure 5B:
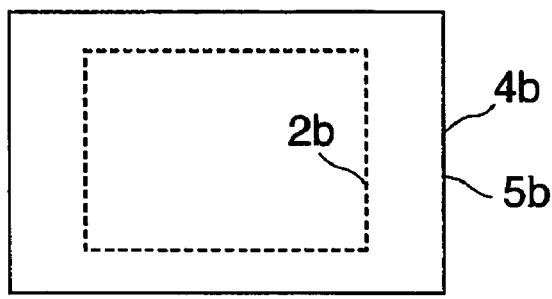
FIG. 5B is a top perspective view thereof.

Hereinbelow, an embodiment 5 of the present invention will be described in detail based on the drawings. The same symbols are assigned to those portions that are the same as those already described in the foregoing embodiments, thereby to omit overlapping description. FIG. 5A is a sectional schematic view showing a light emitter 14 of this embodiment, and FIG. 5B is a top schematic view thereof. A pattern of a lower electrode 2a is formed on a base 1. On the lower electrode 2a is formed a light emitting material layer 3a. A pattern of the light emitting material layer 3a covers all the area of the pattern of the lower electrode 2a. A pattern of a transparent electrode 4a is formed thereon so as to cover all the pattern of the lower electrode 2a. An insulating layer 5a is formed on the light emitting material layer 3a such that a pattern end portion 5b of the insulating layer 5a contacts with a pattern end portion 4b of the transparent electrode 4a. Although not shown in this embodiment, the insulating layer 5a is formed so as to cover all the portion of the light emitting material layer 3a, which is not covered with the transparent electrode 4a.

In the element structure of this embodiment, the transparent electrode 4a is formed over all the area of the pattern of the lower electrode 2a. Further, the transparent electrode 4a is formed over all the area of the light emitting material layer 3a. Therefore, even if the light emitter 14 having the element structure of this embodiment is exposed to the atmosphere, the lower electrode 2a and the light emitting material layer 3a can be shielded from moisture and oxygen contained in the atmosphere by means of the transparent electrode 4a and the insulating layer 5a, so that the lower electrode 2a and the light emitting material layer 3a can be prevented from corrosion.

Further, the element structure of this embodiment is a structure wherein the pattern of the transparent electrode 4a is buried using the insulating layer 5a, so that an upper surface of the element can be made relatively flat. Further, the pattern of the light emitting material layer 3a and the pattern of the lower electrode 2a are all covered with the transparent electrode 4a and the insulating layer 5a, so that it is excellent in anticorrosion against oxygen and water. However, inasmuch as it is necessary to use the insulating layer 5a, one process is additionally required to increase the fabrication cost correspondingly.

Further, in the element structure of this embodiment, a protective layer (later-described protective layer 16 shown in FIGS. 10 to 13) for strongly shielding the lower electrode 2a and the light emitting material layer 3a from water and oxygen in the atmosphere may also be formed on the transparent electrode 4a.

Embodiment 6

Figure 6A:
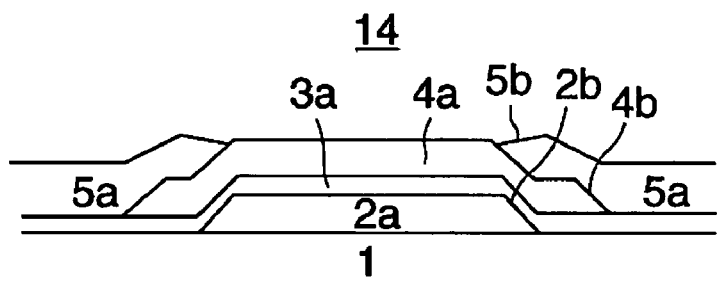
FIG. 6A is a sectional structure schematic view showing a light emitter according to one embodiment of the present invention.
Figure 6B:
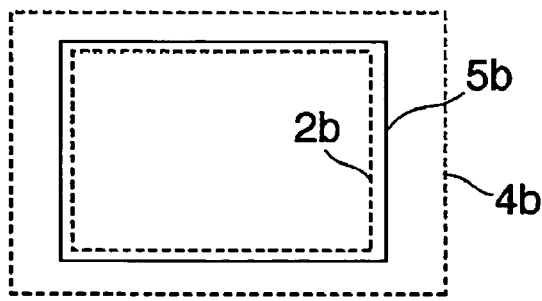
FIG. 6B is a top perspective view thereof.

Hereinbelow, an embodiment 6 of the present invention will be described in detail based on the drawings. The same symbols are assigned to those portions that are the same as those already described in the foregoing embodiments, thereby to omit overlapping description. An element structure shown in FIGS. 6A and 6B is a modification of the element structure shown in FIGS. 5A and 5B, wherein a pattern end portion 5b of an insulating layer 5a is formed in an overlapping manner so as to be located over a pattern end portion 4b of a transparent electrode 4a. By providing an overlapping portion of the insulating layer 5a and the transparent electrode 4a, it is possible to prevent generation of a gap between the pattern end portion 5b of the insulating layer 5a and the pattern end portion 4b of the transparent electrode 4a caused by a fabrication error, thereby to lower probability of corrosion of a light emitting material layer 3a. However, because of existence of an overlapping portion of the insulating layer 5a and a light emitting material pattern (a pattern of light emitting material layer 3a), flatness of an upper surface of the element is degraded as compared with the case of the foregoing embodiment 5 (FIG. 5).

Further, in the element structure of this embodiment, a protective layer (later-described protective layer 16 shown in FIGS. 10 to 13) for strongly shielding the lower electrode 2a and the light emitting material layer 3a from water and oxygen in the atmosphere may also be formed on the transparent electrode 4a.

Embodiment 7

Figure 7A:
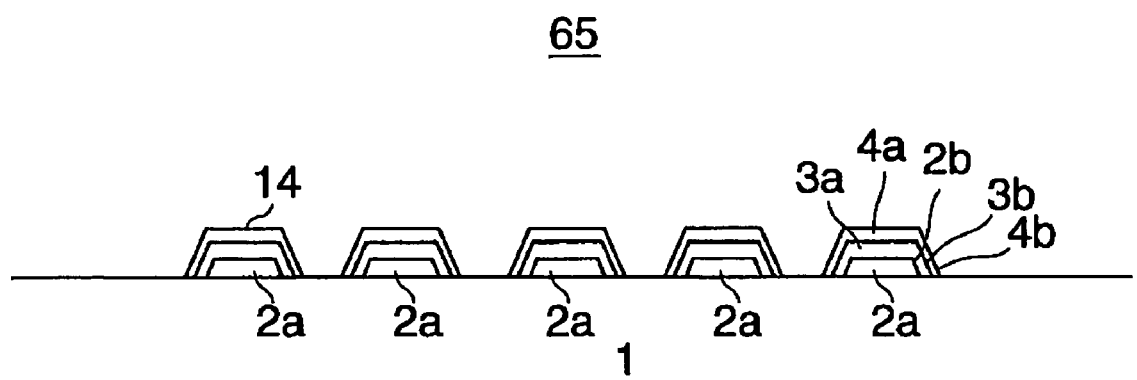
FIG. 7A is a sectional structure schematic view showing a light emitter according to one embodiment of the present invention.
Figure 7B:
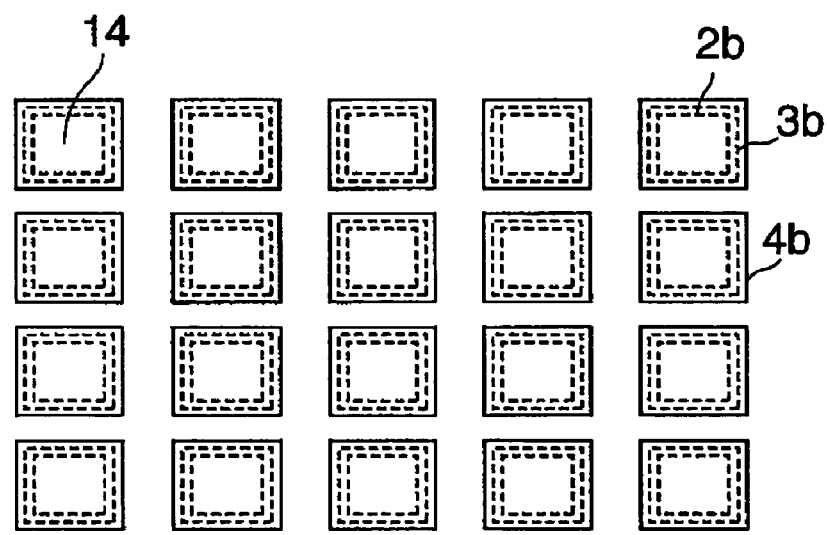
FIG. 7B is a top perspective view thereof.

Hereinbelow, an embodiment 7 of the present invention will be described in detail based on the drawings. The same symbols are assigned to those portions that are the same as those already described in the foregoing embodiments, thereby to omit overlapping description. FIGS. 7A and 7B are a sectional view and a plan view of a light emitting element 65 wherein a plurality of light emitters 14 are arrayed. In each of the light emitters 14, a pattern of a lower electrode 2a is formed on a base 1 and, on the pattern of the lower electrode 2a, a pattern of a light emitting material layer 3a is formed so as to cover all the area thereof. On the pattern of the light emitting material layer 3a is formed a pattern of a transparent electrode 4a so as to cover all the area thereof. Here, a pattern end portion 3b of the light emitting material layer 3a is located outside a pattern end portion 2b of the lower electrode 2a in all the area, and a pattern end portion 4b of the transparent electrode 4a is located outside the pattern end portion 3b of the light emitting material layer 3a in all the area. Such elements are arrayed vertically and horizontally like in the figure. An array of four columns vertically and five rows horizontally is shown here, but it is needless to say that the array number can be freely selected.

Embodiment 8

Figure 8A:
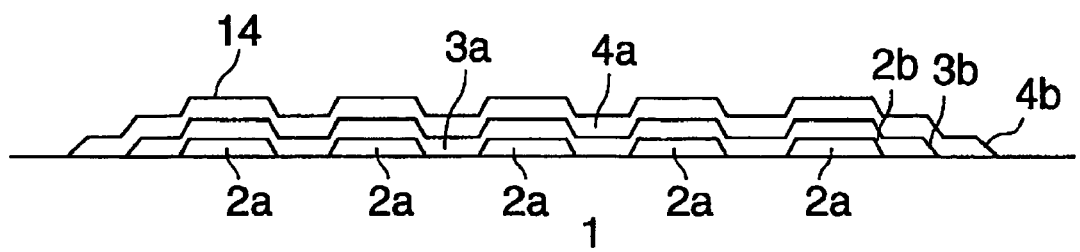
FIG. 8A is a sectional structure schematic view showing a light emitter according to one embodiment of the present invention.
Figure 8B:
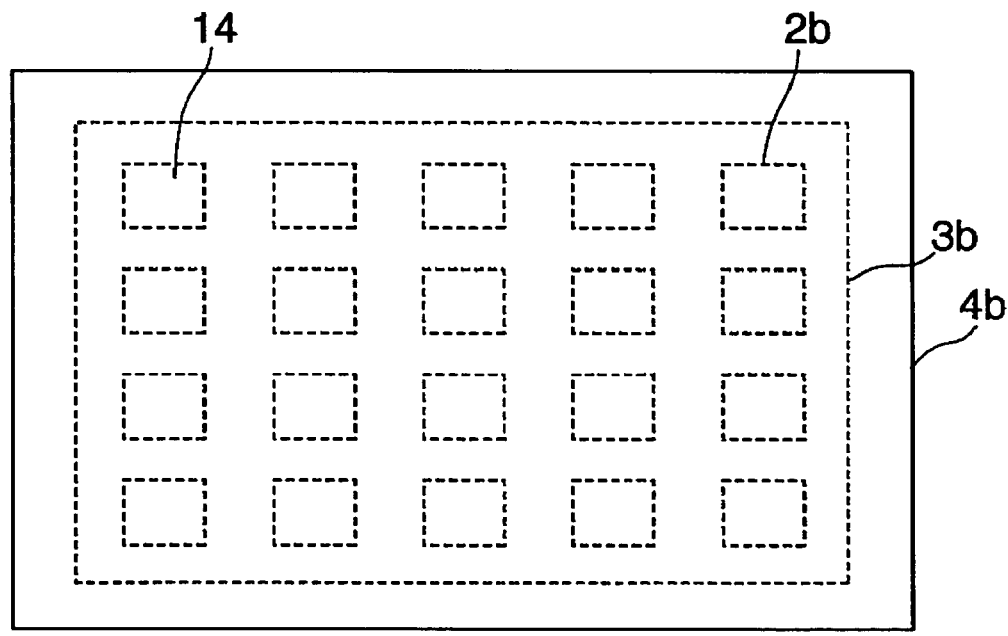
FIG. 8B is a top perspective view thereof.

Hereinbelow, an embodiment 8 of the present invention will be described in detail based on the drawings. The same symbols are assigned to those portions that are the same as those already described in the foregoing embodiments, thereby to omit overlapping description. FIGS. 8A and 8B are a sectional view and a plan view of a light emitting element 65 wherein a plurality of light emitters 14 are arrayed. Patterns of lower electrodes 2a are formed on a base 1 and, on the patterns of the lower electrodes 2a, a pattern of a light emitting material layer 3a is formed so as to cover all the area thereof. The pattern of the light emitting material layer 3a covers the patterns of the plurality of lower electrodes 2a. On the pattern of the light emitting material layer 3a is formed a pattern of a transparent electrode 4a so as to cover all the area thereof. The pattern of the transparent electrode 4a, being one pattern, covers all the area of the patterns of the plurality of lower electrodes 2a and the pattern of the light emitting material layer 3a. Such light emitters 14 are arrayed vertically and horizontally like in the figure. An array of four columns vertically and five rows horizontally is shown, but it is needless to say that the array number can be freely selected. Further, here, the patterns of the light emitting material layer 3a and the transparent electrode 4a are common to all the light emitters 14. However, this is not necessarily required and it is sufficient for those patterns to extend over a plurality of the elements.

Embodiment 9

Figure 9A:
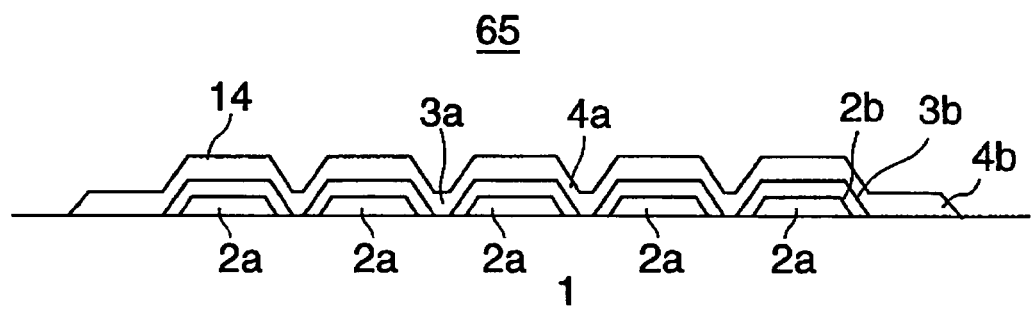
FIG. 9A is a sectional structure schematic view showing a light emitter according to one embodiment of the present invention.
Figure 9B:
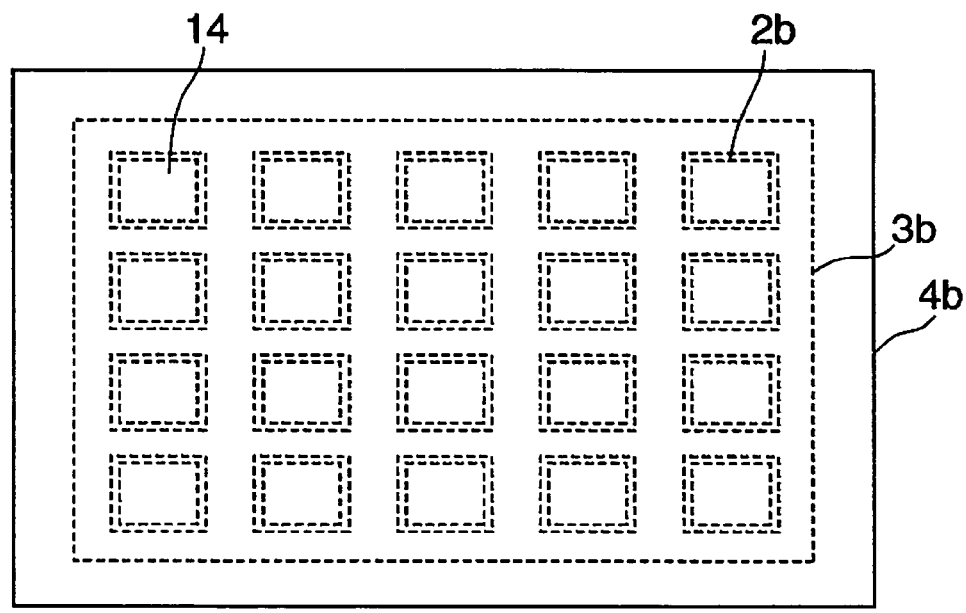
FIG. 9B is a top perspective view thereof.

Hereinbelow, an embodiment 9 of the present invention will be described in detail based on the drawings. The same symbols are assigned to those portions that are the same as those already described in the foregoing embodiments, thereby to omit overlapping description. FIGS. 9A and 9B are a sectional view and a plan view of a light emitting element 65 wherein a plurality of light emitters 14 are arrayed. Patterns of lower electrodes 2a are formed on a base 1 and, on the patterns of the lower electrodes 2a, patterns of a light emitting material layer 3a are formed so as to cover all the area thereof. Here, pattern end portions 3b of the light emitting material layer 3a are formed in an overlapping manner so as to be located over pattern end portions 2b of the lower electrodes 2a. On the patterns of the light emitting material layer 3a is formed a pattern of a transparent electrode 4a so as to cover all the area thereof. The pattern of the transparent electrode 4a, being one pattern, covers the patterns of the plurality of lower electrodes 2a and the patterns of the light emitting material layer 3a. Such light emitters 14 are arrayed vertically and horizontally like in the figure. An array of four columns vertically and five rows horizontally is shown, but it is needless to say that the array number can be freely selected. Further, here, the pattern of the transparent electrode 4a is common to all the light emitters 14. However, this is not necessarily required and it is sufficient for the pattern to extend over a plurality of the elements.

Embodiment 10

Hereinbelow, an embodiment 10 of the present invention will be described in detail based on the drawings. The same symbols are assigned to those portions that are the same as those already described in the foregoing embodiments, thereby to omit overlapping description. FIGS. 10 to 13 show layer structures of light emitters 14 that are applicable to this embodiment.

FIG. 10A shows an element structure wherein a lower electrode 2a, a light emitting layer 9 serving also as a hole injection layer 8 and an electron transport layer 6, and a transparent electrode 4a are formed on the base 1 in the order named. In this case, the light emitting layer 9 corresponds to the foregoing light emitting material layer 3a. FIG. 10B shows an element structure wherein an anode buffer layer 15 is inserted between the light emitting layer 9 serving also as the hole injection layer 8 and the electron transport layer 6, and the transparent electrode 4a. As shown in FIGS. 10C and 10D, a protective layer 16 may be provided at the uppermost portion of the structure shown in FIG. 10A or 10B.

FIG. 11A shows an element structure wherein a lower electrode 2a, a light emitting layer 10 serving also as an electron transport layer 6, a hole injection layer 8, and a transparent electrode 4a are formed on the base 1 in the order named. In this case, the light emitting layer 10 serving also as the electron transport layer 6, and the hole injection layer 8 correspond to the foregoing light emitting material layer 3a. FIG. 11B shows an element structure wherein an anode buffer layer 15 is inserted between the hole injection layer 8 and the transparent electrode 4a. As shown in FIGS. 11C and 11D, a protective layer 16 may be provided at the uppermost portion of the structure shown in FIG. 11A or 11B.

FIG. 12A shows an element structure wherein a lower electrode 2a, an electron transport layer 6, a light emitting layer 11 serving also as a hole injection layer 8, and a transparent electrode 4a are formed on the base 1 in the order named. In this case, the electron transport layer 6 and the light emitting layer 11 serving also as the hole injection layer 8 correspond to the foregoing light emitting material layer 3a. FIG. 12B shows an element structure wherein an anode buffer layer 15 is inserted between the light emitting layer 11 and the transparent electrode 4a. As shown in FIGS. 12C and 12D, a protective layer 16 may be provided at the uppermost portion of the structure shown in FIG. 12A or 12B.

FIG. 13A shows an element structure wherein a lower electrode 2a, an electron transport layer 6, a light emitting layer 7, a hole injection layer 8, and a transparent electrode 4a are formed on the base 1 in the order named. In this case, the electron transport layer 6, the light emitting layer 7, and the hole injection layer 8 correspond to the foregoing light emitting material layer 3a. FIG. 13B shows an element structure wherein an anode buffer layer 15 is inserted between the hole injection layer 8 and the transparent layer 4a. As shown in FIGS. 13C and 13D, a protective layer 16 may be provided at the uppermost portion of the structure shown in FIG. 13A or 13B.

Embodiment 11

Hereinbelow, an embodiment 11 of the present invention will be described in detail based on the drawings. The same symbols are assigned to those portions that are the same as those already described in the foregoing embodiments, thereby to omit overlapping description.

Figure 14:
FIG. 14 is a conceptual view of a light emitting element according to one embodiment of the present invention.

FIG. 14 is a sectional conceptual view showing a light emitting element 65 of the present invention. A light emitter 14 is connected to a current applying element 13, and the current applying element 13 is connected to a switching element 12.

Figure 15:
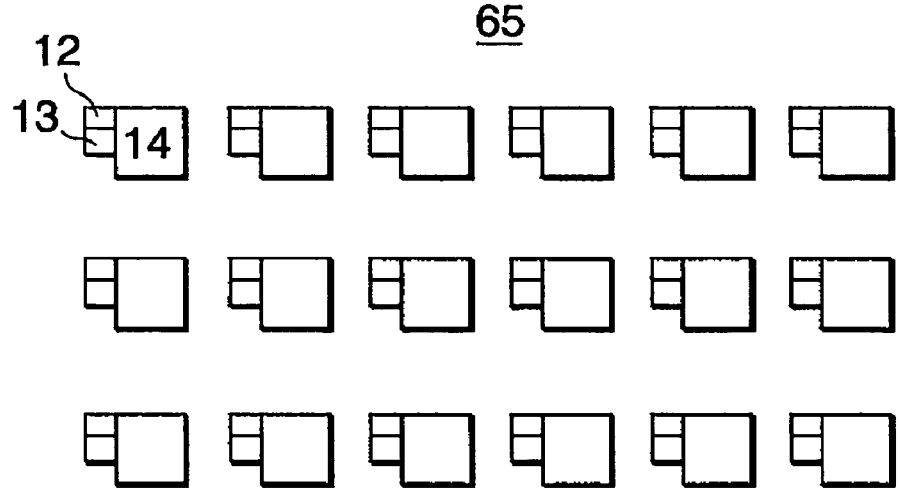
FIG. 15 is a plan conceptual view showing an array of light emitting elements according to one embodiment of the present invention.

A plurality of light emitting elements 65 having such a structure are arranged like in a top schematic view of the light emitting elements 65 shown in FIG. 15. Here, the case of three rows vertically and six columns horizontally is shown. However, the array number can be desirably selected.

Embodiment 12

Figure 16:
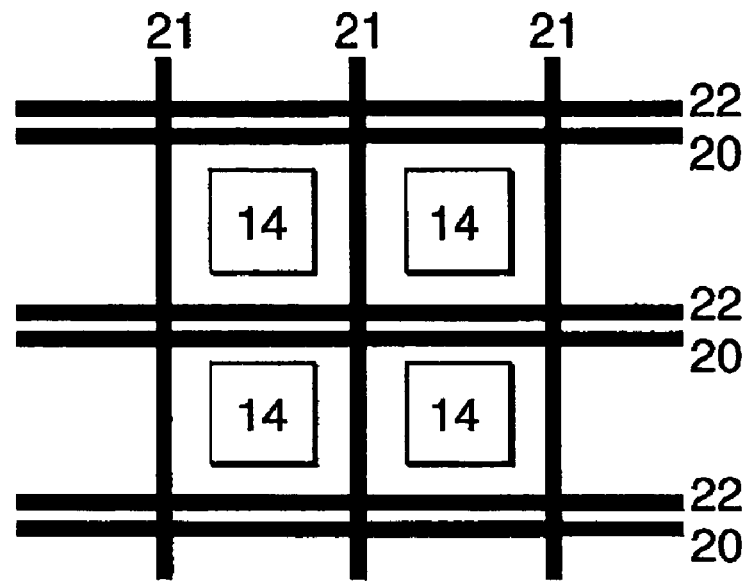
FIG. 16 is a plan schematic view showing a relationship between light emitters and wiring according to one embodiment of the present invention.
Figure 17:
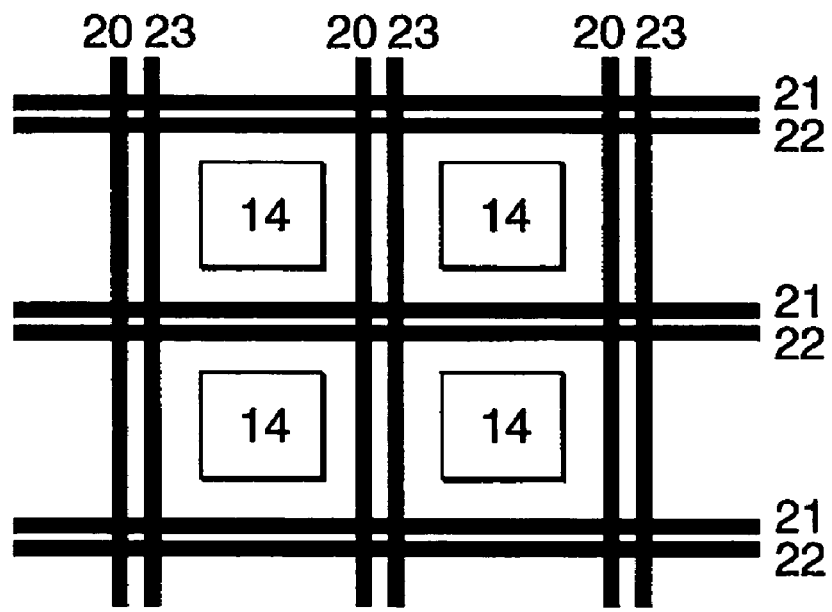
FIG. 17 is a plan schematic view showing a relationship between light emitters and wiring according to one embodiment of the present invention.
Figure 18:
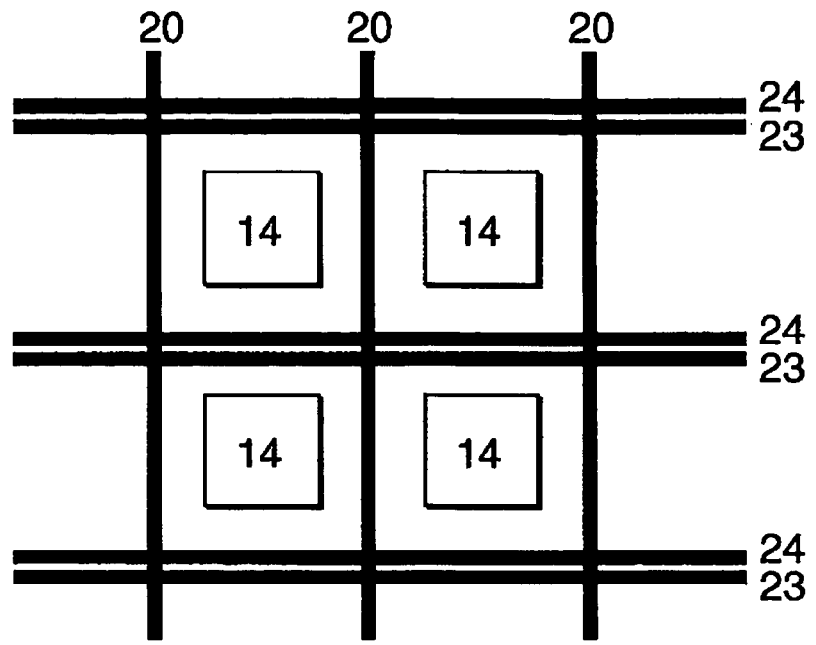
FIG. 18 is a plan schematic view showing a relationship between light emitters and wiring according to one embodiment of the present invention.

Hereinbelow, an embodiment 12 of the present invention will be described in detail based on the drawings. The same symbols are assigned to those portions that are the same as those already described in the foregoing embodiments, thereby to omit overlapping description. Referring to FIGS. 16 to 18, description will be given about a two-dimensional positional relationship of wiring and light emitters 14.

In an element structure shown in FIG. 16, ground wiring 22 and first switching wiring 20 are disposed in horizontal (left and right on the sheet) directions, as facing the sheet, while second switching wiring 21 is disposed in vertical directions. The light emitters 14 are arranged between the wiring (second switching wiring 21) in the vertical directions and the wiring (ground wiring 22 and first switching wiring 20) in the horizontal (left and right on the sheet) directions. The light emitter 14 is connected to the current applying element 13, and the current applying element 13 is connected to the switching element 12 (see FIG. 14). The light emitter 14 is connected to a current source (current source 191 (described later, see FIG. 19)). The ground wiring 22 may be arranged in the vertical directions. Here, the case is shown wherein the light emitters 14 are arrayed in two rows vertically and in two columns horizontally. However, the array number can be suitably selected.

In an element structure shown in FIG. 17, the second switching wiring 21 and the ground wiring 22 are disposed in the horizontal (left and right on the sheet) directions, as facing the sheet, while the first switching wiring 20 and current applying lines 23 are disposed in the vertical directions. The light emitters 14 are arranged between the wiring (first switching wiring 20 and current applying line 23) in the vertical directions and the wiring (second switching wiring 21 and ground wiring 22) in the horizontal (left and right on the sheet) directions. The light emitter 14 is connected to the current applying element 13, and the current applying element 13 is connected to the switching element 12 (see FIG.

14). The ground wiring 22 may be arranged in the vertical directions. The current applying lines 23 may be arranged in the horizontal (left and right on the sheet) directions. Here, the case is shown wherein the light emitters 14 are arrayed in two rows vertically and in two columns horizontally. However, the array number can be suitably selected.

In an element structure shown in FIG. 18, second switching wiring 24 serving also as the ground wiring 22, and the current applying lines 23 are disposed in the horizontal (left and right on the sheet) directions, as facing the sheet, while the first switching wiring 20 is disposed in the vertical directions. The light emitters 14 are arranged between the wiring (first switching wiring 20) in the vertical directions and the wiring (second switching wiring 24 serving also as ground wiring 22, and current applying lines 23) in the horizontal (left and right on the sheet) directions. The light emitter 14 is connected to the current applying element 13, and the current applying element 13 is connected to the switching element 12 (see FIG. 14). The second switching wiring 24 serving also as the ground wiring 22 may be arranged in the vertical directions. Here, the case is shown wherein the light emitters 14 are arrayed in two rows vertically and in two columns horizontally. However, the array number can be suitably selected.

Embodiment 13

Hereinbelow, an embodiment 13 of the present invention will be described in detail based on the drawings. The same symbols are assigned to those portions that are the same as those already described in the foregoing embodiments, thereby to omit overlapping description. Referring to FIGS. 19 to 25, description will be given about a connecting relationship among the light emitter 14, the current applying element 13, the switching element 12, the first switching wiring 20, and the second switching wiring 21.

Figure 19:
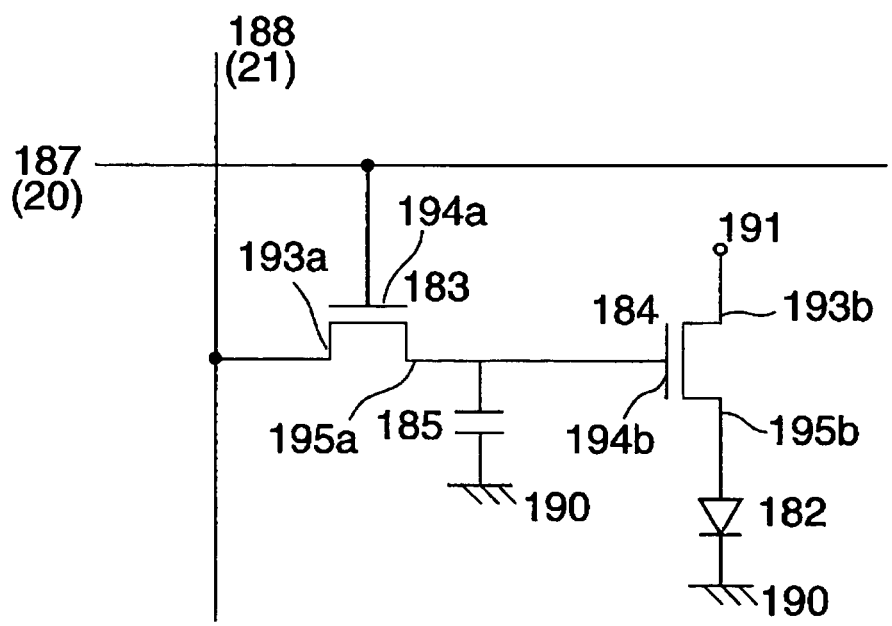
FIG. 19 is a plan schematic view showing an electrical connection relationship between a light emitting element and wiring according to one embodiment of the present invention.

FIG. 19 is a circuit schematic diagram of a light emitting element 65 applicable to the present invention. Referring to FIG. 19, in this embodiment, it has an element structure wherein a switching transistor is used as the switching element 12, and a current applying transistor is used as a current feed element.

As shown in FIG. 19, first switching wiring 187 (first switching wiring 20) and second switching wiring 188 (second switching wiring 21) are arrayed vertically and horizontally. A source portion 193a of a first switching transistor 183 and a gate portion 194a thereof are connected to the second switching wiring 188 (second switching wiring 21) and the first switching wiring 187 (first switching wiring 20), respectively. A drain portion 195a is connected to a gate portion 194b of a second switching transistor 184 (current applying transistor) and one terminal of a voltage holing capacitor 185. The other terminal of the voltage holding capacitor 185 is connected to ground 190. A source portion 193b of the second switching transistor 184 (current applying transistor) is connected to the current source 191, and a drain portion 195b is connected to an anode of a light emitter 182. A cathode of the light emitter 182 is connected to ground 190.

When a voltage is applied to the first switching wiring 187 (first switching wiring 20), the voltage is applied to the gate portion 194a of the first switching transistor 183 so that the source portion 193a and the drain portion 195a are electrically connected. When a voltage is applied to the second switching wiring 188 (second switching wiring 21) in this state, the voltage is applied to the drain portion 195a so that charge is stored in the voltage holding capacitor 185. Therefore, even if the voltage applied to the first switching wiring 187 (first switching wiring 20) or the second switching wiring 188 (second switching wiring 21) is stopped, the voltage continues to be applied to the gate portion 194b of the second switching transistor 184 (current applying transistor) until the charge stored in the voltage holding capacitor 185 is consumed. Since the voltage is applied to the gate portion 194b of the second switching transistor 184 (current applying transistor), the source portion 193b and the drain portion 195b are electrically connected, and therefore the current flows from the current source 191 to ground 190 passing through the light emitter 182, so that the light emitter 182 emits light.

On the other hand, if the driving voltage is not applied to at least one of the first switching wiring 187 (first switching wiring 20) and the second switching wiring 188 (second switching wiring 21), inasmuch as the voltage is not applied to the drain portion 195a of the second switching transistor 184 (current applying transistor), the current does not flow through the light emitter 182 so that no light emission occurs.

Figure 20:
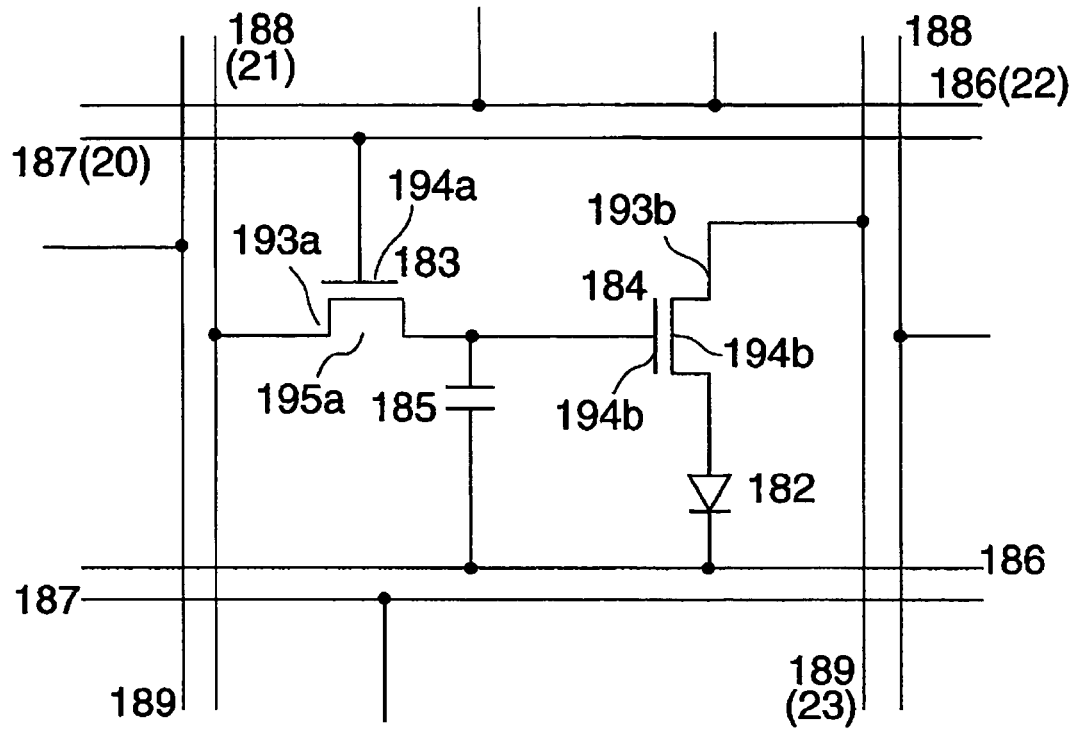
FIG. 20 is a plan schematic view showing an electrical connection relationship between a light emitting element and wiring according to one embodiment of the present invention.
Figure 21:
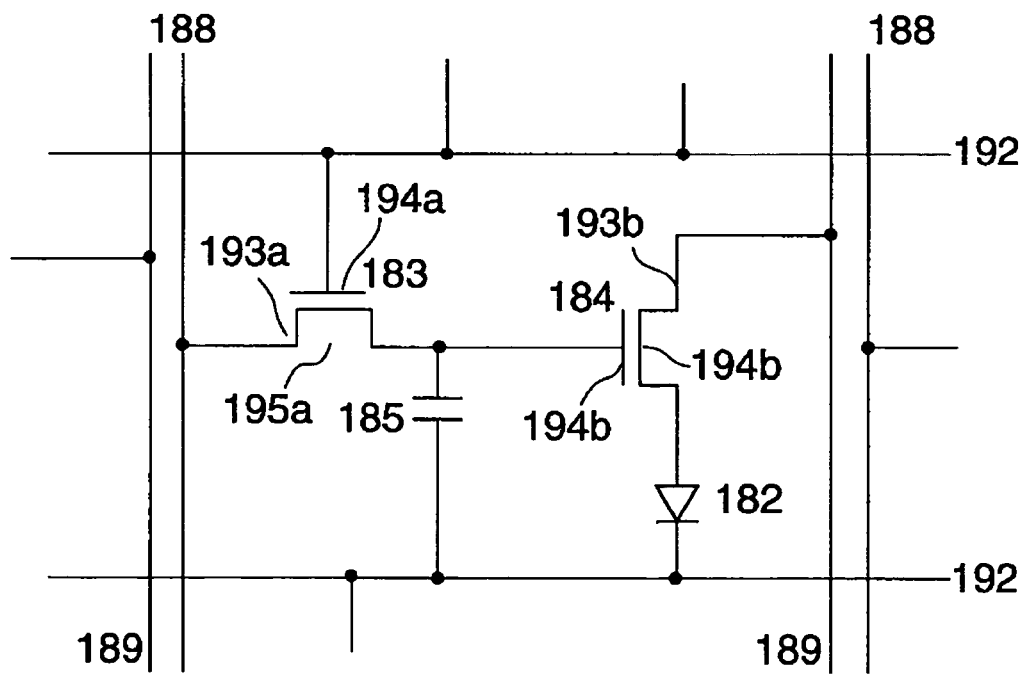
FIG. 21 is a plan schematic view showing an electrical connection relationship between a light emitting element and wiring according to one embodiment of the present invention.

FIG. 20 shows an element structure wherein ground wiring 186 (ground wiring 22) and current feed wiring 189 (current applying lines 23) are added in the element structure shown in FIG. 19. FIG. 21 shows an element structure wherein the first switching wiring 187 (first switching wiring 20) and wiring for ground 190 are made common so as to be common wiring 192 in the structure shown in FIG. 19.

Figure 22:
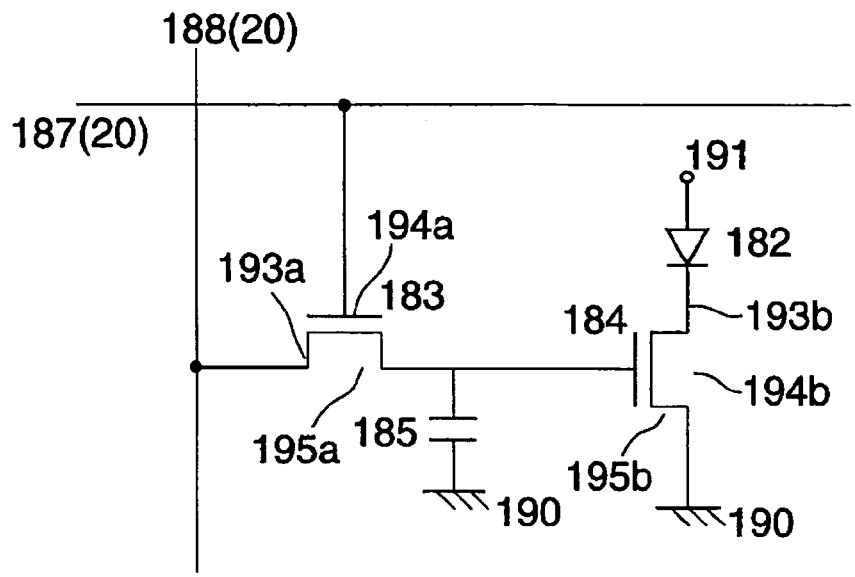
FIG. 22 is a plan schematic view showing an electrical connection relationship between a light emitting element and wiring according to one embodiment of the present invention.

FIG. 22 is a diagram showing electrical connection among the first switching wiring 187 (first switching wiring 20), the second switching wiring 188 (second switching wiring 21), the switching element 12, the current applying element 13, and the light emitting element 65. Here, the case is shown wherein a switching transistor is used as the switching element 12, and a current applying transistor is used as the current feed element. Wiring for switching comprises the first switching wiring 187 (first switching wiring 20) and the second switching wiring 188 (second switching wiring 21). The source portion 193a of the first switching transistor 183 and the gate portion 194a thereof are connected to the second switching wiring 188 (second switching wiring 21) and the first switching wiring 187 (first switching wiring 20), respectively. The drain portion 195a is connected to the gate portion 194b of the second switching transistor 184 (current applying transistor) and simultaneously connected to one terminal of the voltage holding capacitor 185. The other terminal of the voltage holding capacitor 185 is connected to ground 190. The source portion 193b of the second switching transistor 184 (current applying transistor) is connected to the cathode side of the light emitter 182, and the drain portion 195b is connected to ground 190. The anode portion of the light emitter 182 is connected to the current source 191. Here, wiring for ground 190 and current applying wiring are omitted.

In the element structure of this embodiment, when the driving voltage is fed simultaneously to the first switching wiring 187 (first switching wiring 20) and the second switching wiring 188 (second switching wiring 21), the voltage is given to the drain portion 195a of the first switching transistor 183 and thus charge is stored in the voltage holding capacitor 185, so that the stable potential is applied to the gate portion 194b of the second switching transistor 184 (current applying transistor). Therefore, the current flows from the current source 191 passing through the light emitter 182, and further, the current flows from the gate portion 194b of the second switching transistor 184 (current applying transistor) to ground 190 passing through the drain portion 195b. This can cause the light emitter 182 to emit light.

On the other hand, if the driving voltage is not applied to at least one of the first switching wiring 187 (first switching wiring 20) and the second switching wiring 188 (second switching wiring 21), inasmuch as the voltage is not applied to the gate portion 194b of the second switching transistor 184 (current applying transistor), the current does not flow through the light emitter 182 so that no light emission occurs.

Figure 23:
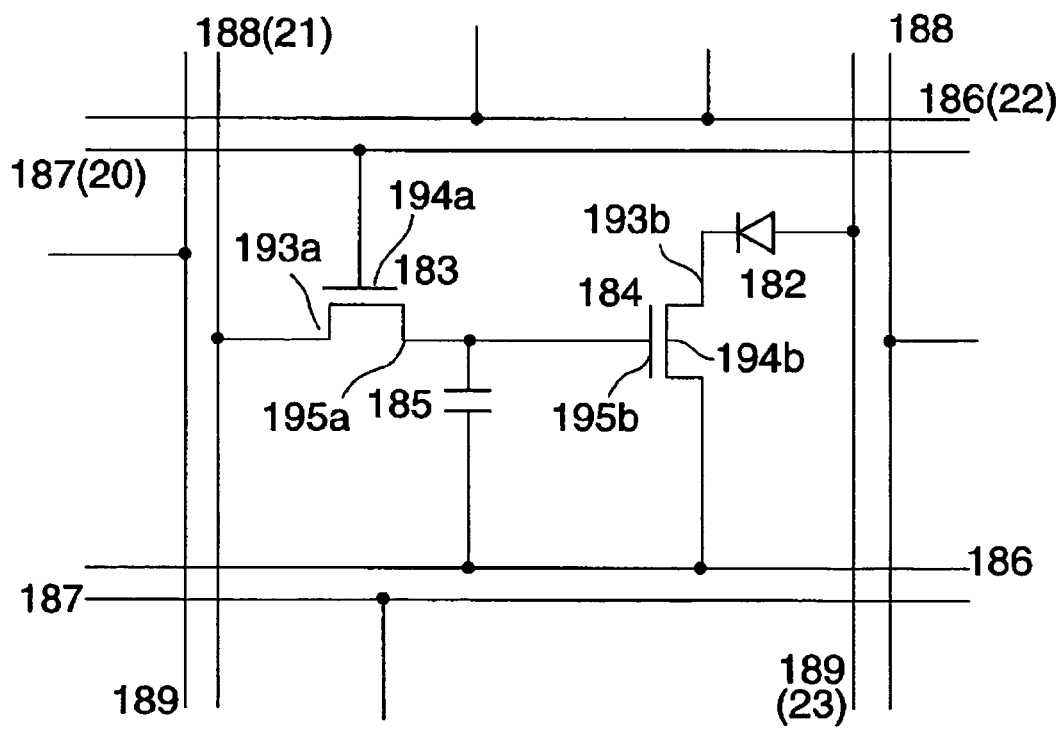
FIG. 23 is a plan schematic view showing an electrical connection relationship between a light emitting element and wiring according to one embodiment of the present invention.
Figure 24:
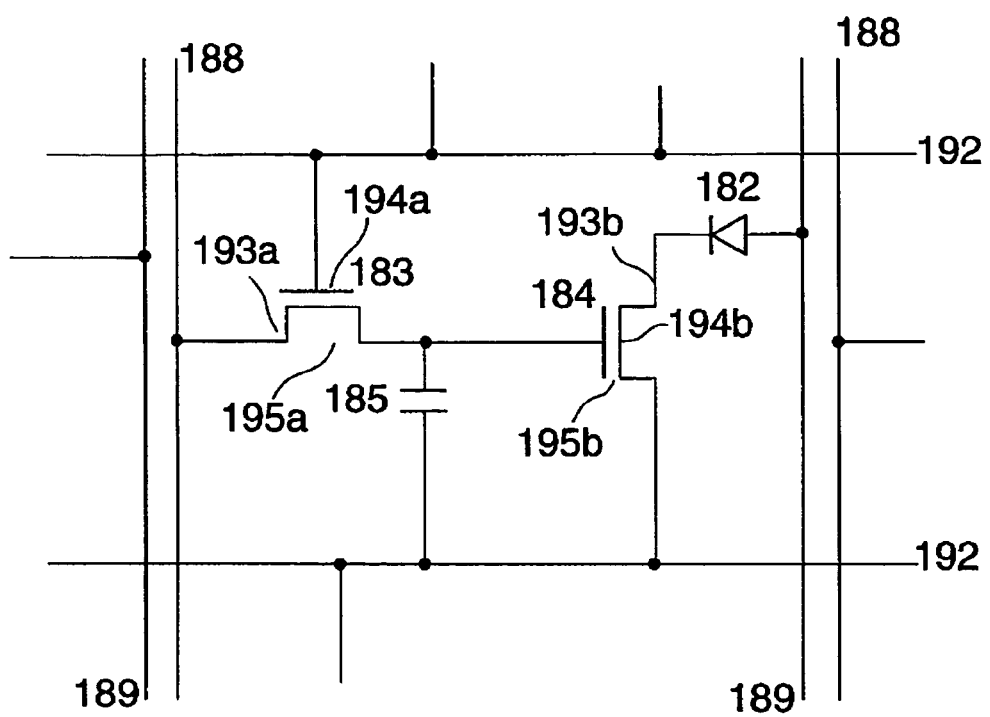
FIG. 24 is a plan schematic view showing an electrical connection relationship between a light emitting element and wiring according to one embodiment of the present invention.

FIG. 23 shows an element structure wherein ground wiring 186 (ground wiring 22) and current feed wiring 189 (current applying lines 23) are added in the structure shown in FIG. 22. FIG. 24 shows an element structure wherein the first switching wiring 187 (first switching wiring 20) and wiring for ground 190 are made common so as to be common wiring 192 in the structure shown in FIG. 22.

Embodiment 14

Hereinbelow, an embodiment 14 of the present invention will be described in detail based on the drawings. The same symbols are assigned to those portions that are the same as those already described in the foregoing embodiments, thereby to omit overlapping description. Hereinbelow, description will be given about modifications of arraying manners of the light emitters 14 or 182, relations to the surface of a substrate, stacked structures, etc. which are applicable to the present invention.

Figure 25:
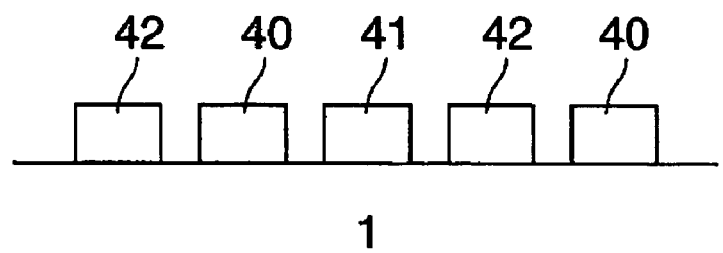
FIG. 25 is a sectional conceptual view showing an array of light emitting elements according to one embodiment of the present invention.

FIG. 25 is a sectional conceptual view showing an array of the light emitters 14 or 182. In an element structure shown in FIG. 25, a first-color light emitting element 40, a second-color light emitting element 41, and a third-color light emitting element 42 are alternately arrayed on a base 1. Typically, the first-color light emitting element 40, the second-color light emitting element 41, and the third-color light emitting element 42 are selected from a light emitting element (light emitting element 65) using blue as a main component, a light emitting element (light emitting element 65) using green as a main component, and a light emitting element (light emitting element 65) using red as a main component.

Figure 26:
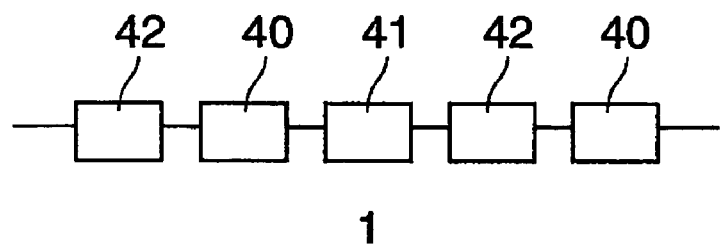
FIG. 26 is a sectional conceptual view showing an array of light emitting elements according to one embodiment of the present invention.

FIG. 26 is a sectional schematic view showing an array of the light emitters 14 or 182. In an element structure shown in FIG. 26, a first-color light emitting element 40, a second-color light emitting element 41, and a third-color light emitting element 42 are alternately arrayed with at least part thereof buried in a base 1. Typically, the first-color light emitting element 40, the second-color light emitting element 41, and the third-color light emitting element 42 are selected from a light emitting element (light emitting element 65) using blue as a main component, a light emitting element (light emitting element 65) using green as a main component, and a light emitting element (light emitting element 65) using red as a main component.

Figure 27:
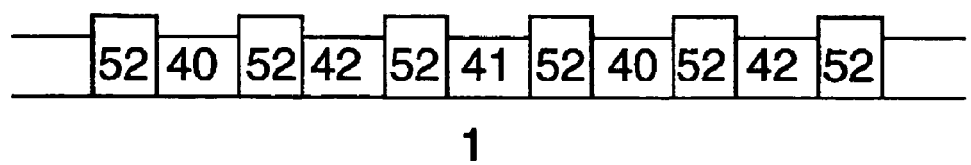
FIG. 27 is a sectional conceptual view showing an array of light emitting elements according to one embodiment of the present invention.

FIG. 27 is a sectional conceptual view showing an array of the light emitters 14 or 182. In an element structure shown in FIG. 27, a first-color light emitting element 40, a second-color light emitting element 41, and a third-color light emitting element 42 are alternately arrayed on a base 1. Banks 52 are formed between the individual elements. Typically, the first-color light emitting element 40, the second-color light emitting element 41, and the third-color light emitting element 42 are selected from a light emitting element (light emitting element 65) using blue as a main component, a light emitting element (light emitting element 65) using green as a main component, and a light emitting element (light emitting element 65) using red as a main component.

Figure 28:
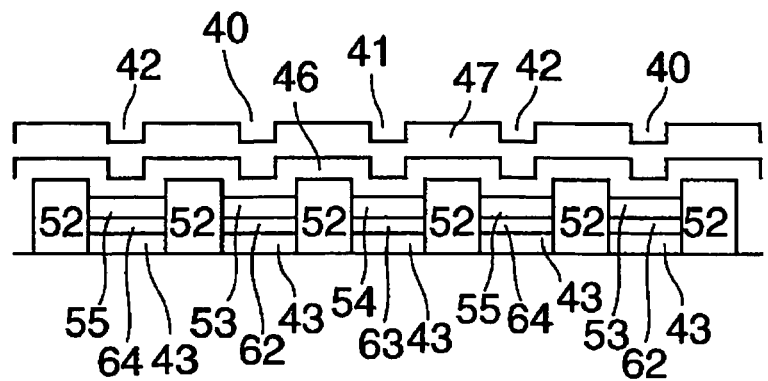
FIG. 28 is a sectional conceptual view showing an array of light emitting elements according to one embodiment of the present invention.

FIG. 28 is a sectional conceptual view showing an array of the light emitters 14 or 182. In an element structure shown in FIG. 28, a stacked structure pattern (first-color light emitting element 40) including a metal electrode layer 43 (lower electrode 2a)/a first-color electron transport layer 62/a first-color light emitting layer 53, a stacked structure pattern (second-color light emitting element 41) including a metal electrode layer 43 (lower electrode 2a)/a second-color electron transport layer 63/a second-color light emitting layer 54, and a stacked structure pattern (third-color light emitting element 42) including a metal electrode layer 43 (lower electrode 2a)/a third-color electron transport layer 64/a third-color light emitting layer 55 are alternately arrayed on a base 1. Banks 52 are formed between the individual elements. A hole injection layer 46 (hole injection layer 8) and a transparent electrode 47 (transparent electrode 4a) are formed thereover so as to extend over a plurality of the elements. Typically, the first color, the second color, and the third color are selected from light having blue as a main component, light having green as a main component, and light having red as a main component.

Figure 29:
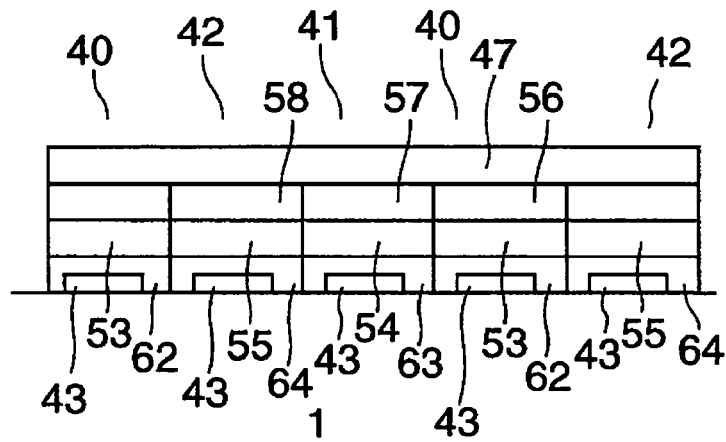
FIG. 29 is a sectional conceptual view showing an array of light emitting elements according to one embodiment of the present invention.

FIG. 29 is a sectional conceptual view showing an array of the light emitters 14 or 182. In an element structure shown in FIG. 29, a stacked structure pattern (first-color light emitting element 40) including a metal electrode layer 43 (lower electrode 2a)/a first-color electron transport layer 62/a first-color light emitting layer 53/a first-color hole injection layer 56, a stacked structure pattern (second-color light emitting element 41) including a metal electrode layer 43 (lower electrode 2a)/a second-color electron transport layer 63/a second-color light emitting layer 54/a second-color hole injection layer 57, and a stacked structure pattern (third-color light emitting element 42) including a metal electrode layer 43 (lower electrode 2a)/a third-color electron transport layer 64/a third-color light emitting layer 55/a third-color hole injection layer 58 are alternately arrayed on a base 1. A transparent electrode 47 (transparent electrode 4a) is formed thereover so as to extend over a plurality of the elements. Typically, the first color, the second color, and the third color are selected from light having blue as a main component, light having green as a main component, and light having red as a main component.

Figure 30:
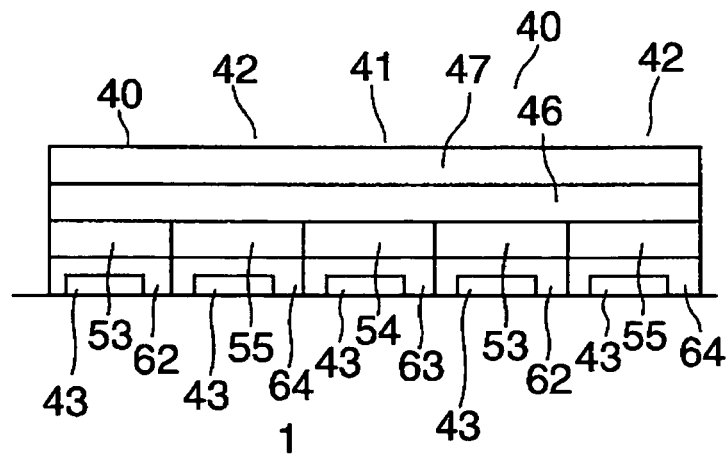
FIG. 30 is a sectional conceptual view showing an array of light emitting elements according to one embodiment of the present invention.

FIG. 30 is a sectional conceptual view showing an array of the light emitters 14 or 182. In an element structure shown in FIG. 30, a stacked structure pattern (first-color light emitting element 40) including a metal electrode layer 43 (lower electrode 2a)/a first-color electron transport layer 62/a first-color light emitting layer 53, a stacked structure pattern (second-color light emitting element 41) including a metal electrode layer 43 (lower electrode 2a)/a second-color electron transport layer 63/a second-color light emitting layer 54, and a stacked structure pattern (third-color light emitting element 42) including a metal electrode layer 43 (lower electrode 2a)/a third-color electron transport layer 64/a third-color light emitting layer 55 are alternately arrayed on a base 1. A hole injection layer 46 (hole injection layer 8) and a transparent electrode 47 (transparent electrode 4a) are formed thereover so as to extend over a plurality of the elements. Typically, the first color, the second color, and the third color are selected from light having blue as a main component, light having green as a main component, and light having red as a main component.

Figure 31:
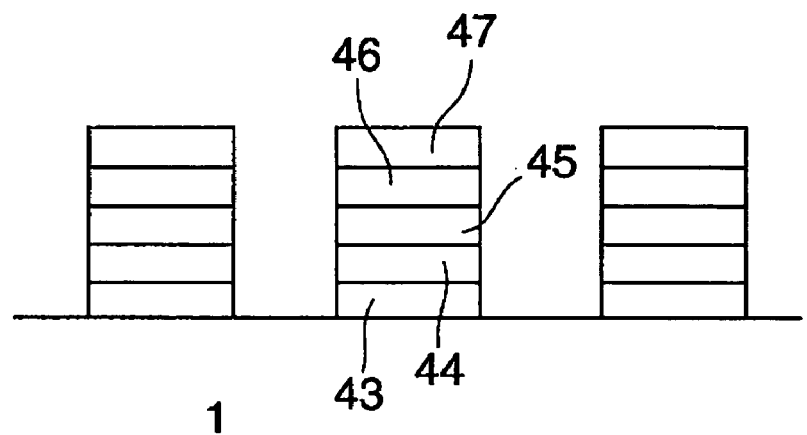
FIG. 31 is a sectional conceptual view showing an array of light emitting elements according to one embodiment of the present invention.

FIG. 31 is a sectional conceptual view showing an array of the light emitters 14 or 182. In an element structure shown in FIG. 31, stacked structures each including a lower electrode 43 (lower electrode 2a)/an electron transport layer 44 (electron transport layer 6)/a light emitting layer 45 (light emitting layer 7)/a hole injection layer 46 (hole injection layer 8)/a transparent electrode 47 (transparent electrode 4a) are alternately arrayed on a base 1 with a gap interposed therebetween.

Figure 32:
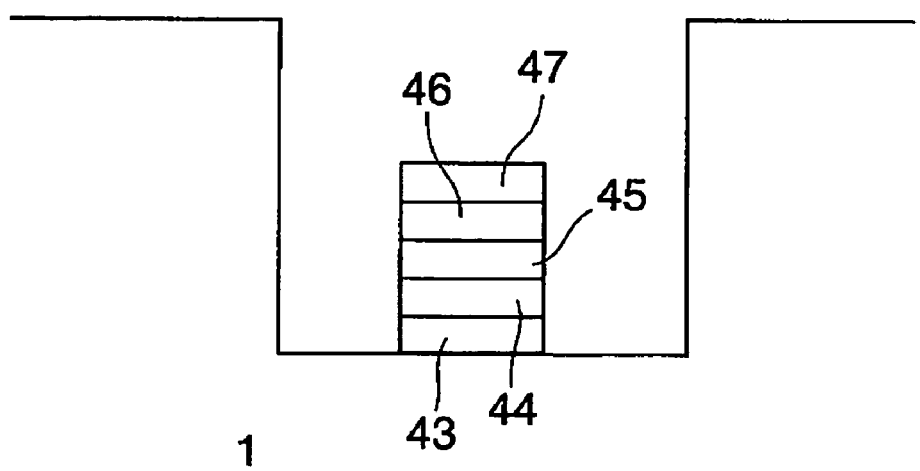
FIG. 32 is a sectional conceptual view showing an array of a light emitting element according to one embodiment of the present invention.

FIG. 32 is a sectional conceptual view showing an array of the light emitters 14 or 182. In an element structure shown in FIG. 32, a recessed portion is formed on a base 1, and a stacked structure pattern including a metal electrode layer 43

(lower electrode 2a)/an electron transport layer 44 (electron transport layer 6)/a light emitting layer 45 (light emitting layer 7)/a hole injection layer 46 (hole injection layer 8)/a transparent electrode 47 (transparent electrode 4a) is formed therein.

Embodiment 15

Hereinbelow, an embodiment 15 of the present invention (more concrete structure of light emitting element 65 applied with the present invention) will be described in detail based on the drawings. The same symbols are assigned to those portions that are the same as those already described in the foregoing embodiments, thereby to omit overlapping description.

FIG. 33 is a more detailed sectional view of the light emitting element 65 applied with the present invention. FIG. 33 shows the light emitting element 65 and the current applying element 13 for the light emitting element 65. In an element structure shown in FIG. 33, a barrier layer 205 is formed on a base 1. A channel region (gate portion 194), a source portion 193 and a drain portion 195 of a thin film semiconductor (TFT=Thin Film Transistor) are formed thereon like in the figure. A gate insulating film 198 is formed thereon. Of the gate insulating film 198, portions located on the source portion 193 and the drain portion 195 of the TFT are formed with holes. A gate electrode 206 is formed on the gate insulating film 198 at a portion thereof located on the channel region (gate portion 194) of the TFT. A first interlayer insulating film 199 is formed thereon, but portions thereof located over the source portion 193 and the drain portion 195 are formed with holes. At these hole portions, a source electrode 200 and a drain electrode 201 are formed so as to contact with the source portion 193 and the drain portion 195. A second interlayer insulating film 202 is further formed thereon excluding the drain electrode 201 like in the figure. Though not shown here, the source electrode 200 is connected to the switching element 12.

On the second interlayer insulating film 202, a pattern of a metal electrode 203 is formed so as to contact with one side of the drain electrode 201. A light emitting material layer 204 (light emitting material layer 3a) and a transparent electrode 197 (transparent electrode 4a) are formed thereon in order. As the light emitting material layer 204 (light emitting material layer 3a), a three-layer film composed of the electron transport layer 44 (electron transport layer 6)/the light emitting layer 204 (light emitting material layer 3a)/the hole injection layer 46 (hole injection layer 8), a two-layer film composed of the light emitting material layer 204 (light emitting material layer 3a) serving also as the electron transport layer 44 (electron transport layer 6)/the hole injection layer 46 (hole injection layer 8), or a single-layer film composed of the light emitting material layer 204 (light emitting material layer 3a) serving also as the electron transport layer 44 (electron transport layer 6) and the hole injection layer 46 (hole injection layer 8) is used.

In this embodiment, the case is shown wherein the light emitting material layer 204 (light emitting material layer 3a) and the transparent electrode 197 (transparent electrode 4a) are patterned, which, however, may also include a case wherein each of them has a large pattern extending over a plurality of the elements.

FIG. 34 is a more detailed sectional view of the light emitter 14 or 182 applied with the present invention. An element structure shown in FIG. 34 differs from the element structure shown in FIG. 33 in that the light emitting material layer 204 (light emitting material layer 3a) is not in contact with the drain electrode 201, while the transparent electrode 197 (transparent electrode 4a) is in contact with the drain electrode 201.

Figure 35:
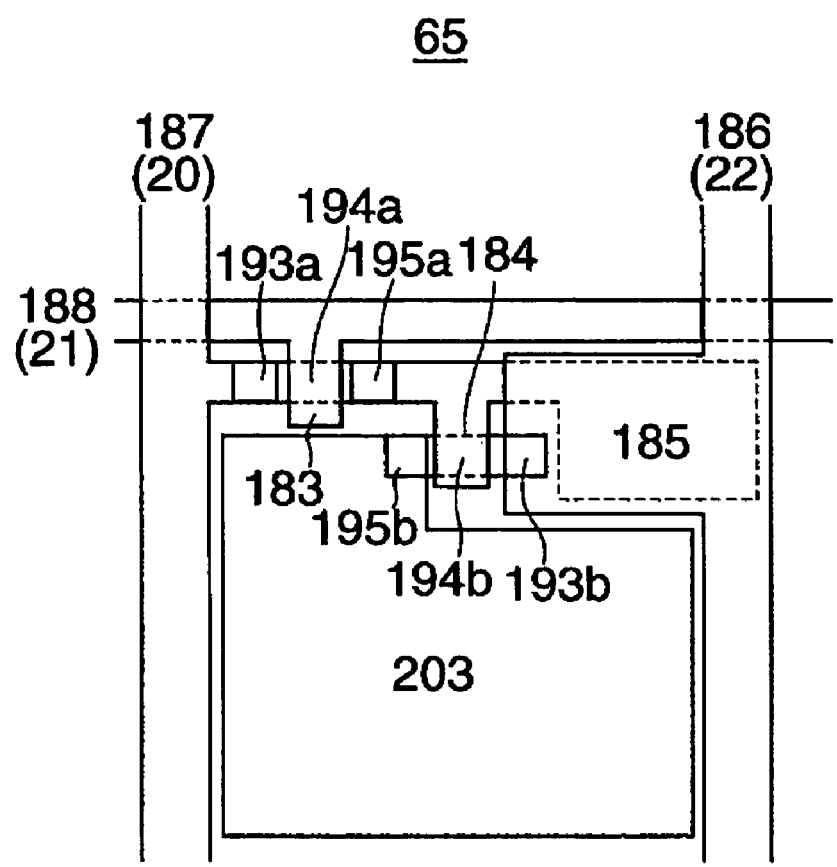
FIG. 35 is a top schematic view showing a structure of a light emitting element according to one embodiment of the present invention.

FIG. 35 is a typical plan view of a peripheral portion of the light emitting element 65 including a wiring portion when the element having the sectional structure shown in FIG. 33 or 34 is applied. First switching wiring 187 (first switching wiring 20) (gate line) is connected to a gate portion 194a of a first switching transistor 183. Second switching wiring 188 (second switching wiring 21) (data line) is connected to a source portion 193a of the first switching transistor 183. A drain portion 195b of the first switching transistor 183 is connected to a gate portion 194b of a second switching transistor 184 (current applying transistor) and simultaneously connected to one terminal of a voltage holding capacitor 185 (a lower side of voltage holding capacitor 185 in the figure) formed between itself and ground wiring 186 (ground wiring 22). The other terminal of the voltage holding capacitor 185 (an upper side of voltage holding capacitor 185 in the figure) is connected to the ground wiring 186 (ground wiring 22). A source portion 193b of the second switching transistor 184 (current applying transistor) is connected to the metal electrode 203.

The light emitting material layer 204 (light emitting material layer 3a) and the transparent electrode 197 (transparent electrode 4a) thereon are formed (not shown) over the whole surface of the element shown in FIG. 35, and the transparent electrode 197 (transparent electrode 4a) is connected to a current source (current source 191). The drain portion 195b of the second switching transistor 184 (current applying transistor) is connected to the ground wiring 186 (ground wiring 22).

The following can be typically used for the respective members constituting the light emitting element 65.

TABLE 1

| | |
|---|---|
| substrate | glass, resin, quartz |
| transparent electrode layer | ITO (indium tin oxide, mixture of In oxide and Zn oxide) |
| metal electrode layer | MgAg, Al, LiAl |
| electron transport layer | aluminum-quinolinol complex (Alq), PBD, TAZ, BND, oxadiazole derivative (OXD), OXD-7, polyphenylenevinylene (PPV) |
| light emitting layer | material obtained by adding red fluorescent coloring matter to aluminum-quinolinol complex, aluminum-quinolinol complex, beryllium benzoquinolinol complex, oxazole complex of zinc |
| | material containing precursor of conjugate high molecular organic compound and at least one kind of fluorescent substance; as precursor, for example, polyvinylenephenylene or derivative thereof; as fluorescent coloring matter, rhodamine B, distyryl biphenyl, coumarin, tetraphenylbutadiene, quinacridone, or derivative thereof |
| hole injection layer | triphenyldiamine derivative (TPD), porphyrin compound such as copper phthalocyanine, α-NPD |
| anode buffer layer | CuPc, polyaniline, polythiophene |
| protective layer | Al oxide, Al nitride, Si oxide, Si nitride, or mixture thereof |
| switching element | transistor |
| current applying element | transistor |
| switching wiring, current applying wiring, second switching wiring, common wiring, ground wiring | Al, Cu, Ta, Ru, WSi |

Further, the following can be used for the respective components constituting the first switching transistor 183 and the second switching transistor 184 (current applying transistor).

TABLE 2

| source drain electrode, gate electrode | Al, Cu, Ta, Ru, WSi |
|---|---|
| gate insulating film, first interlayer insulating film, second interlayer insulating film, barrier layer | Al oxide, Ak nitride, Si oxide, Si nitride, or mixture thereof |

Next, a typical fabrication method for the light emitting element 65 (element structure shown in FIG. 33) applied with the present invention will be described with reference to FIGS. 36 to 47.

Figures 36, 37, 38:
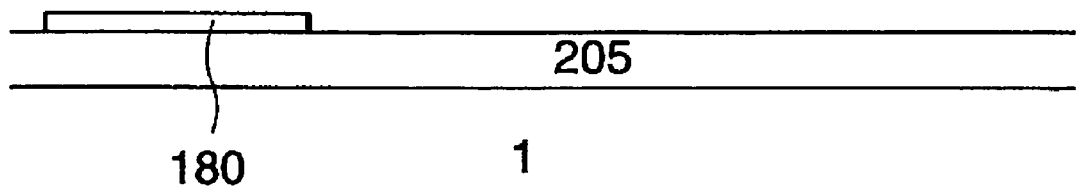
FIG. 36 is a sectional schematic view showing a first fabrication process of a light emitting element according to one embodiment of the present invention.
FIG. 37 is a sectional schematic view showing a second fabrication process of a light emitting element according to one embodiment of the present invention.
FIG. 38 is a sectional schematic view showing a third fabrication process of a light emitting element according to one embodiment of the present invention.

In this embodiment, a base 1 is first prepared as shown in FIG. 36. Typically, the base 1 is made of non-alkali glass. As shown in FIG. 37, a barrier layer 205 is formed on the base 1 by the use of the sputtering method or the CVD (Chemical Vapor Deposition) method.

As shown in FIG. 38, a silicon 180 is formed thereon by the use of the sputtering method or the CVD method, typically the LP (Low Pressure) CVD method applied with a temperature of about 500° C., and is polycrystallized by laser irradiation.

Figure 39:
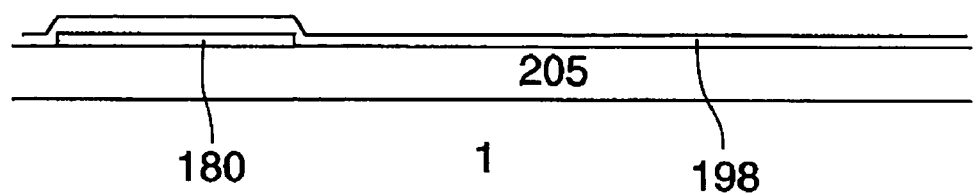
FIG. 39 is a sectional schematic view showing a fourth fabrication process of a light emitting element according to one embodiment of the present invention.
Figure 40:
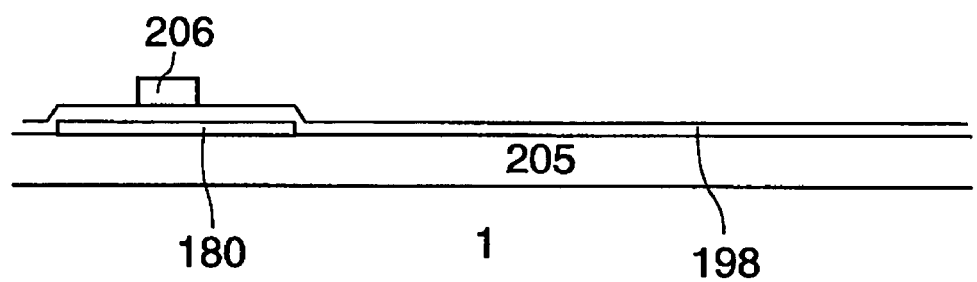
FIG. 40 is a sectional schematic view showing a fifth fabrication process of a light emitting element according to one embodiment of the present invention.

Then, a gate insulating film 198 is formed by the sputtering method or the CVD method as shown in FIG. 39. Typically, a film of $SiO_2$ (silicon oxide) is formed by a remote plasma CVD method. A pattern of a gate electrode 206 is formed thereon as shown in FIG. 40. The pattern of the gate electrode 206 can be formed such that a film of the gate electrode 206, typically a film of WSi (tungsten silicide), is formed by, for example, the sputtering method or the vapor deposition method, a photoresist is applied thereto by the spin-coat method and patterned by exposure using an optical mask and development, portions of the film of the gate electrode 206 where no photoresist pattern exists are removed from the above by the use of the milling method, and finally, the photoresist is removed by a method of dissolving it in a solvent, or the like.

Figure 41:
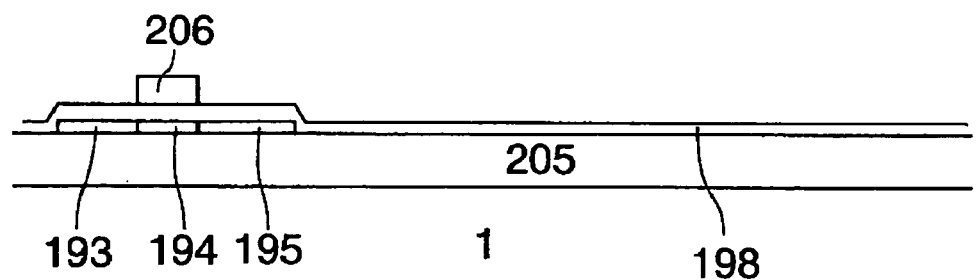
FIG. 41 is a sectional schematic view showing a sixth fabrication process of a light emitting element according to one embodiment of the present invention.

Then, after portions other than a portion where the silicon 180 is formed are covered with a resist, boron or phosphorus is ion-doped to form a source portion 193 and a drain portion 195 as shown in FIG. 41. For activating the source portion 193 and the drain portion 195, a heat treatment is typically applied thereto at a temperature of about 550° C.

Figure 42:
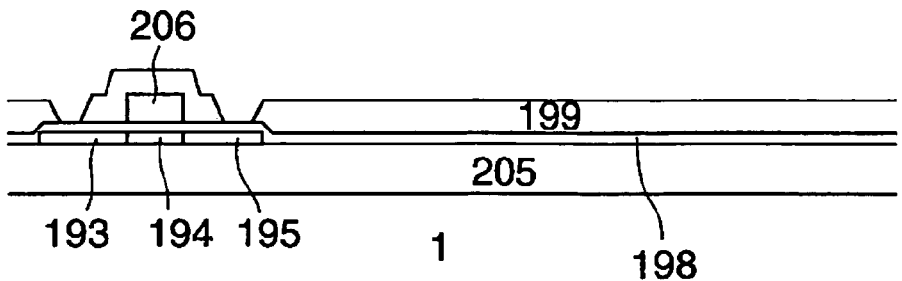
FIG. 42 is a sectional schematic view showing a seventh fabrication process of a light emitting element according to one embodiment of the present invention.

Then, as shown in FIG. 42, a first interlayer insulating film 199, typically $SiO_2$, is formed by the sputtering method or the CVD method, then the gate insulating film 198 and the first interlayer insulating film 199 formed at the source portion 193 and the drain portion 195 are removed. Also in this event, the technique upon the foregoing patterning of the gate electrode 206 can be used.

Figure 43:
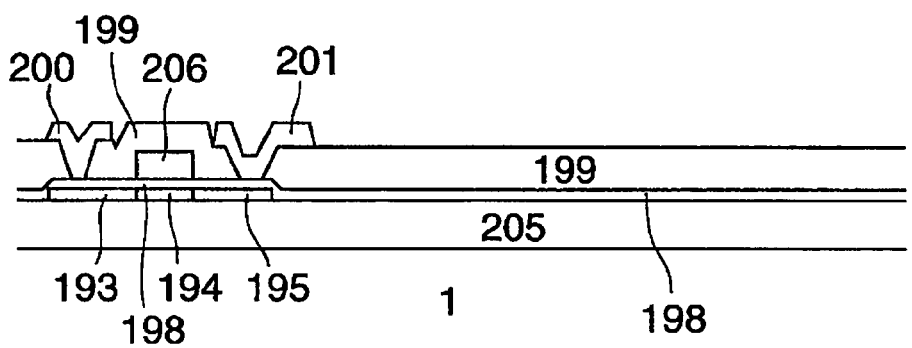
FIG. 43 is a sectional schematic view showing an eighth fabrication process of a light emitting element according to one embodiment of the present invention.
Figure 44:
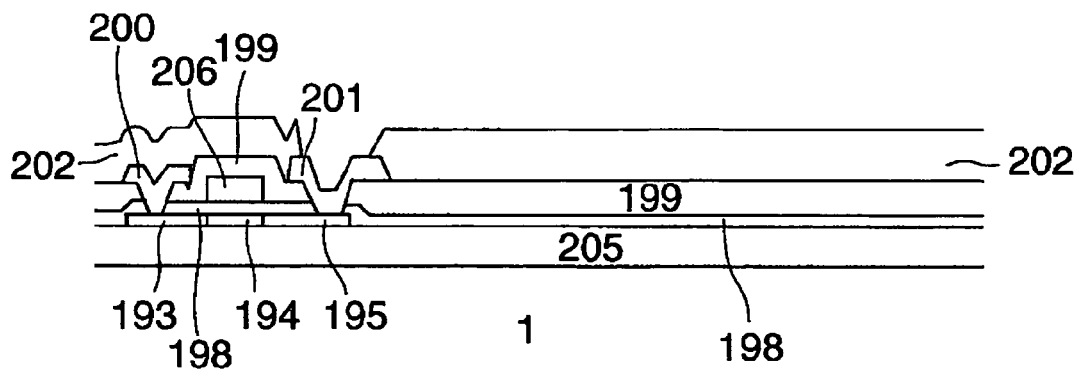
FIG. 44 is a sectional schematic view showing a ninth fabrication process of a light emitting element according to one embodiment of the present invention.

Then, as shown in FIG. 43, a source electrode 200 and a drain electrode 201, typically patterns of Al (aluminum), are formed. Also in this event, the technique upon the foregoing patterning of the gate electrode 206 can be used. As shown in FIG. 44, a second interlayer insulating film 202, typically a pattern of $SiO_2$, is formed thereon. Also in this event, the technique upon the foregoing patterning of the gate electrode 206 can be used.

Figure 45:
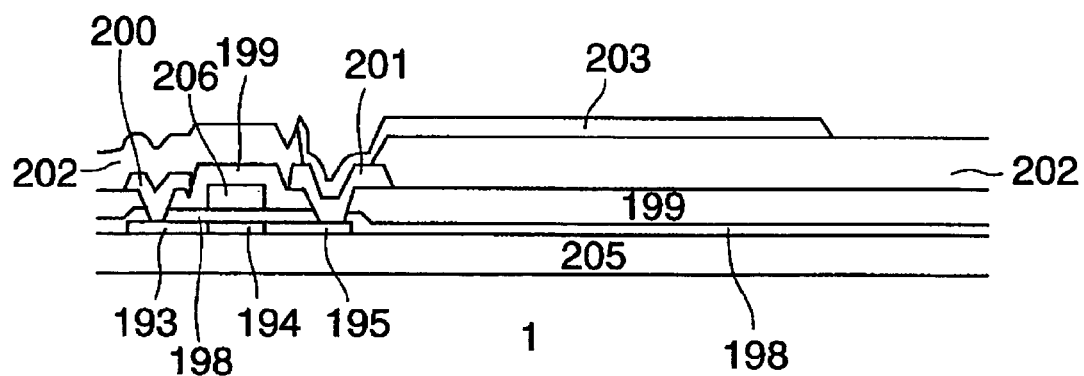
FIG. 45 is a sectional schematic view showing a tenth fabrication process of a light emitting element according to one embodiment of the present invention.
Figure 46:
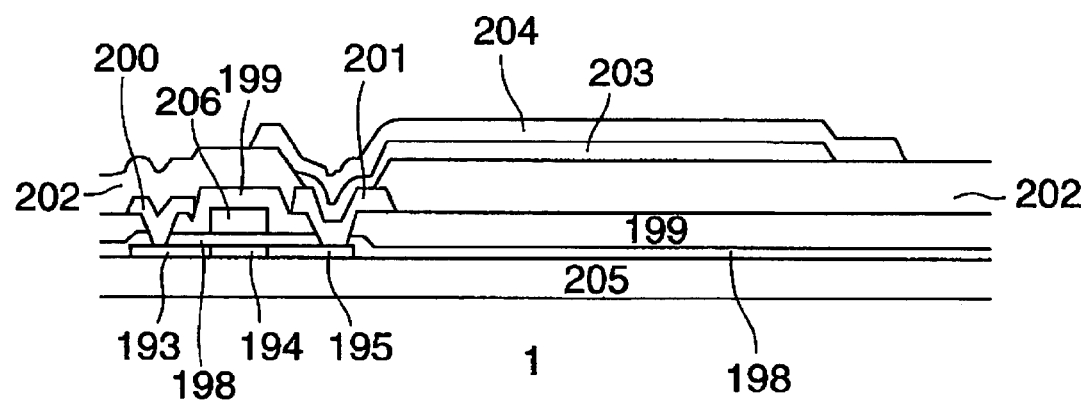
FIG. 46 is a sectional schematic view showing an eleventh fabrication process of a light emitting element according to one embodiment of the present invention.
Figure 47:
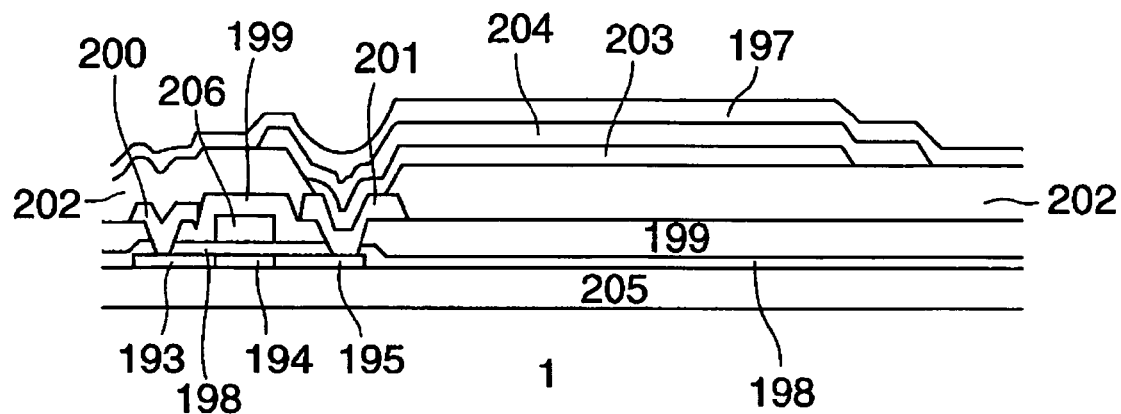
FIG. 47 is a sectional schematic view showing a twelfth fabrication process of a light emitting element according to one embodiment of the present invention.

Then, a pattern of a metal electrode 203 is formed as shown in FIG. 45. Also in this event, the technique upon the foregoing patterning of the gate electrode 206 can be used. As shown in FIG. 46, a pattern of a light emitting material layer 204 (light emitting material layer 3a) is formed thereon. In this event, the vapor deposition method using a metal mask or a formation technique using an inkjet injection head is used. A transparent electrode 197 (transparent electrode 4a) is formed thereon as shown in FIG. 47.

The transparent electrode 197 (transparent electrode 4a) is formed in the shape of a film by the sputtering method, the CVD method or the spin-coat method. Thereafter, it is patterned using the technique used upon the foregoing patterning of the gate electrode 206.

Embodiment 16

A light emitting display device was prepared on an experimental basis using the light emitting elements 65 having the element structures shown in FIGS. 1, 9A, 9B, 11B, 33 and 35. The size of one unit element is 30 μm×100 μm, and the size of a display portion is 50 mm×50 mm (millimeter).

Figure 48:
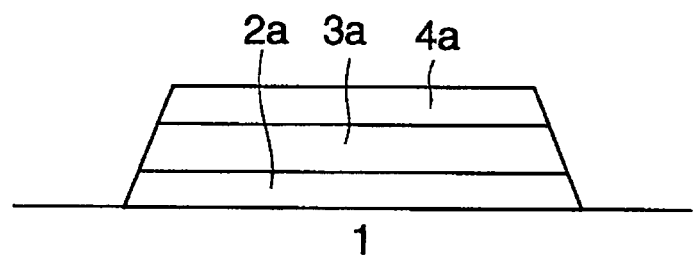
FIG. 48 is a top schematic view showing a structure of a light emitting element of one example according to one embodiment of the present invention.

For comparison, an element having a structure of which a sectional schematic view is shown in FIG. 48, was also prepared on an experimental basis. In the element structure shown in FIG. 48, a lower electrode 2a, a light emitting material layer 3a, and a transparent electrode 4a are patterned with substantially the same size.

Upon preparing these elements on an experimental basis, non-alkali glass was used for the base 1, AlLi (alloy of lithium and aluminum) for the metal electrode 43 (lower electrode 2a), α-NPD for the hole injection layer, and aluminum-quinolinol complex (Alq3) for the light emitting layer 7 serving also as the electron transport layer 6. Polyaniline was used for the anode buffer layer 15. A mixture of In (indium) oxide and Zn (zinc) oxide was used for the transparent electrode 4a. Al (aluminum) was used for the first switching wiring 20, the second switching wiring 21, and the ground wiring 22.

Transistors were used for the switching element 12 and the current applying element 13. Al was used for the source electrode 200 and the drain electrode 201 of the transistor, WSi (tungsten silicide) for the gate electrode 206, and Si oxide for the gate insulating film 198, the first interlayer insulating film 199, the second interlayer insulating film 202, and the barrier layer 205.

A potential of 5 volts was applied to an anode portion in the form of the transparent electrode 4a of each of the light emitting display devices of these two kinds, and further, a potential of 5 volts was applied to all the first switching wiring 20 (gate line) and the second switching wiring 21 (data line), then a time until light emission from the element was completely finished was measured at a room temperature with the naked eye. In case of the element having the element structure shown in FIG. 48, a light emission lasting time was only five minutes, while light emission lasted for 500 hours or longer in case of the light emitting element 65 having the element structure of the present invention.

It is presumed that in the element structure shown in FIG. 48, inasmuch as the patterns of the lower electrode 2a, the light emitting layer 7, and the transparent electrode 4a were substantially the same, invasion of water and oxygen from the pattern end portion 4b of the transparent electrode 4a into the pattern of the light emitting layer 7 and the pattern of the lower electrode 2a was caused, and therefore, the patterns of the light emitting layer 7 and the lower electrode 2a were subjected to generation of corrosion so as to be degraded for a short time.

In contrast, in the light emitting element 65 applied with the present invention, it is considered that since the pattern of the lower electrode 2a and the pattern of the light emitting material layer 3a were covered with the pattern of the transparent electrode 4a made of an oxide, invasion of water and oxygen from the pattern end portion 4b of the transparent electrode 4a into the pattern of the light emitting layer 7 and the pattern of the lower electrode 2a was not caused, and therefore, corrosion of the patterns of the light emitting layer 7 and the lower electrode 2a did not occur so that light emission was made possible for a long time.

It is clear that the present invention is not limited to the foregoing respective embodiments, and that the foregoing respective embodiments can be suitably changed within a range of engineering thought of the present invention. Further, the numbers, positions, shapes, etc. of the foregoing constituent members are not limited to the foregoing respective embodiments, but can be set to the numbers, positions, shapes, etc. that are preferable upon carrying out the present invention. In the respective figures, the same symbols are assigned to the same components.

The invention claimed is:

1. A light emitter, comprising:
   a lower electrode;
   a light emitting layer formed on the lower electrode; and
   a transparent electrode formed on the light emitting layer,
   wherein a portion of the transparent electrode is formed corresponding to the lower electrode,
   wherein a surface area of a pattern of the transparent electrode completely covers and is larger than a surface area of a pattern of the lower electrode, the pattern of the transparent electrode not overlapping with an adjacent lower electrode of an adjacent light emitter arranged adjacent to the light emitter, the adjacent light emitter comprising the adjacent lower electrode, and the lower electrode is arranged between the transparent electrode and a substrate.

2. The light emitter of claim 1, further comprising an insulating layer,
   wherein an end portion of the insulating layer contacts the pattern of the light emitting layer.

3. The light emitter of claim 2, wherein the light emitter emits light when current is applied to the light emitting layer.

4. The light emitter of claim 3, comprising at least three groups of independent light emitters,
   wherein a first light emitter group emits light at a wavelength in a red region,
   wherein a second light emitter group emits light at a wavelength in a green region,
   wherein a third light emitter group emits light at a wavelength in a blue region.

5. The light emitter of claim 2, comprising at least three groups of independent light emitters,
   wherein a first light emitter group emits light at a wavelength in a red region,
   wherein a second light emitter group emits light at a wavelength in a green region,
   wherein a third light emitter group emits light at a wavelength in a blue region.

6. The light emitter of claim 1, further comprising an insulating layer,
   wherein the insulating layer is formed on the light emitting layer,
   wherein an end portion of the insulating layer contacts the transparent electrode.

7. The light emitter of claim 1, comprising at least three groups of independent light emitters,
   wherein a first light emitter group emits light at a wavelength in a red region,
   wherein a second light emitter group emits light at a wavelength in a green region,
   wherein a third light emitter group emits light at a wavelength in a blue region.

8. A light emitting element, comprising:
   a light emitter; and
   a current applying element coupled to the light emitter,
   wherein the light emitter is further comprised of:
   a lower electrode;
   a light emitting layer formed on the lower electrode; and
   a transparent electrode formed on the light emitting layer,
   wherein a portion of the transparent electrode is formed corresponding to the lower electrode,
   wherein a surface area of a pattern of the transparent electrode completely covers and is larger than a surface area of a pattern of the lower electrode, the pattern of the transparent electrode not overlapping with an adjacent lower electrode of an adjacent light emitter arranged adjacent to the light emitter, the adjacent light emitter comprising the adjacent lower electrode, and the lower electrode is arranged between the transparent electrode and a substrate, and
   wherein the light emitter emits light when current is applied to the light emitting layer.

9. The light emitting element of claim 8,
   wherein a plurality of light emitters comprise at least three groups of independent light emitters,
   wherein a first light emitter group emits light at a wavelength in a red region,
   wherein a second light emitter group emits light at a wavelength in a green region,
   wherein a third light emitter group emits light at a wavelength in a blue region.

10. The light emitting element of claim 8,
    wherein the current applying element comprises a thin film transistor having a gate, a drain and a source,
    wherein the transparent electrode or the lower electrode is coupled to the drain or the source.

11. The light emitting element of claim 10, further comprising a switching element coupled to the current applying element.

12. The light emitting element of claim 8, further comprising a switching element coupled to the current applying element.

13. The light emitting element according to claim 12,
    wherein the switching element comprises at least one transistor,
    wherein a drain of the transistor is coupled to a gate of a transistor included in the current applying element.

14. The light emitting element of claim 13, further comprising:
    wiring for feeding current to the current applying element; and
    wiring for applying switching information to the switching element.

15. The light emitting element of claim 14,
    wherein a plurality of the light emitting elements form a display device,
    wherein wiring for feeding current to the current applying element, and wiring for applying switching information to the switching element are arranged in a matrix.

16. The light emitting element of claim 12, further comprising:
    wiring for feeding current to the current applying element; and
    wiring for applying switching information to the switching element.

17. A light emitter, comprising:
a lower electrode;
an electron transport layer formed on the lower electrode;
a light emitting layer formed on the electron transport layer;
a hole injection layer formed on the light emitting layer; and
a transparent electrode formed on the hole injection layer,
wherein a portion of the transparent electrode is formed corresponding to the lower electrode, and
wherein a surface area of a pattern of the transparent electrode completely covers and is larger than a surface area of a pattern of the lower electrode, the pattern of the transparent electrode not overlapping with an adjacent lower electrode of an adjacent light emitter arranged adjacent to the light emitter, the adjacent light emitter comprising the adjacent lower electrode, and the lower electrode is arranged between the transparent electrode and a substrate.

18. The light emitter of claim 17, further comprising an anode buffer layer formed between the hole injection layer and the transparent electrode.

19. The light emitter of claim 17, further comprising a protective layer formed on the transparent electrode.

20. The light emitter of claim 17, further comprising a protective layer formed on the transparent electrode.

* * * * *